United States Patent
Sawa et al.

(10) Patent No.: US 10,522,596 B2
(45) Date of Patent: Dec. 31, 2019

(54) SEMICONDUCTOR STORAGE DEVICE COMPRISING RESISTANCE CHANGE FILM AND METHOD OF MANUFACTURING THE SAME

(71) Applicant: TOSHIBA MEMORY CORPORATION, Minato-ku (JP)

(72) Inventors: Keiichi Sawa, Yokkaichi (JP);
Kazuhisa Matsuda, Yokkaichi (JP);
Atsushi Takahashi, Yokkaichi (JP);
Takaumi Morita, Yokkaichi (JP);
Masayuki Tanaka, Yokkaichi (JP);
Shinji Mori, Nagoya (JP); Kazuhiro Matsuo, Kuwana (JP); Yuta Saito, Yokkaichi (JP); Kenichiro Toratani, Kuwana (JP); Hisashi Okuchi, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/892,016

(22) Filed: Feb. 8, 2018

(65) Prior Publication Data
US 2019/0027538 A1    Jan. 24, 2019

(30) Foreign Application Priority Data
Jul. 18, 2017    (JP) .................................. 2017-139387

(51) Int. Cl.
*H01L 27/24*    (2006.01)
*G11C 13/00*    (2006.01)
(Continued)

(52) U.S. Cl.
CPC ........ *H01L 27/249* (2013.01); *G11C 13/0002* (2013.01); *H01L 45/1253* (2013.01);
(Continued)

(58) Field of Classification Search
CPC ............ G11C 2213/15; G11C 2213/52; G11C 2213/82; H01L 27/10808; H01L 27/10817;
(Continued)

(56) References Cited

U.S. PATENT DOCUMENTS 7,433,222 B2    10/2008    Hosoi et al.
7,796,416 B2    9/2010    Ishihara et al.
(Continued)

FOREIGN PATENT DOCUMENTS

JP    3989506    10/2007
JP    2008-181978    8/2008
(Continued)

*Primary Examiner* — Mohsen Ahmadi
(74) *Attorney, Agent, or Firm* — Oblon, McClelland, Maier & Neustadt, L.L.P.

(57) ABSTRACT

In one embodiment, a semiconductor storage device includes a first interconnect extending in a first direction, a plurality of second interconnects extending in a second direction different from the first direction, and a plurality of first insulators provided alternately with the second interconnects. The device further includes a resistance change film provided between the first interconnect and at least one of the second interconnects and including a first metal layer or a first semiconductor layer that includes a first face provided on a first interconnect side and a second face provided on a second interconnect side, at least any of the first face and the second face having a curved plane shape.

12 Claims, 28 Drawing Sheets

(51) Int. Cl.
*H01L 27/108* (2006.01)
*H01L 45/00* (2006.01)

(52) U.S. Cl.
CPC ...... *H01L 45/1683* (2013.01); *G11C 13/0007* (2013.01); *G11C 2213/51* (2013.01); *G11C 2213/71* (2013.01); *G11C 2213/81* (2013.01); *H01L 27/10808* (2013.01); *H01L 27/10817* (2013.01); *H01L 27/2409* (2013.01)

(58) Field of Classification Search
CPC ............... H01L 27/10835; H01L 27/49; H01L 27/2409
See application file for complete search history.

(56) References Cited

U.S. PATENT DOCUMENTS

| | | | |
|---|---|---|---|
| 7,910,914 B2 | 3/2011 | Tanaka et al. | |
| 8,053,364 B2 | 11/2011 | French et al. | |
| 8,373,222 B2 | 2/2013 | Sekine et al. | |
| 8,450,713 B2 | 5/2013 | Awaya et al. | |
| 8,759,806 B2 | 6/2014 | Yamaguchi et al. | |
| 8,891,277 B2 | 11/2014 | Murooka | |
| 8,912,521 B2* | 12/2014 | Nojiri | H01L 45/16 257/2 |
| 8,912,655 B2 | 12/2014 | Nakajima | |
| 9,129,677 B2 | 9/2015 | Murooka | |
| 9,224,788 B2 | 12/2015 | Kobayashi et al. | |
| 9,257,572 B2 | 2/2016 | Seol et al. | |
| 9,318,702 B2* | 4/2016 | Fest | H01L 45/16 |
| 9,406,721 B1* | 8/2016 | Yamamoto | H01L 45/144 |
| 9,595,567 B2 | 3/2017 | Yamamoto | |
| 2008/0280390 A1 | 11/2008 | Kim et al. | |
| 2011/0037046 A1* | 2/2011 | Sato | H01L 45/124 257/4 |
| 2011/0175048 A1* | 7/2011 | Sekine | H01L 27/2409 257/2 |
| 2012/0217461 A1 | 8/2012 | Kobayashi et al. | |
| 2012/0295398 A1 | 11/2012 | Kurunczi et al. | |
| 2013/0248801 A1* | 9/2013 | Yamamoto | H01L 27/249 257/4 |
| 2014/0374691 A1* | 12/2014 | Nansei | H01L 27/2409 257/4 |
| 2015/0270312 A1* | 9/2015 | Tajima | H01L 27/249 257/5 |
| 2016/0293839 A1 | 10/2016 | Suzuki et al. | |

FOREIGN PATENT DOCUMENTS

| | | |
|---|---|---|
| JP | 2008-283179 | 11/2008 |
| JP | 4203506 | 1/2009 |
| JP | 2010-199348 | 9/2010 |
| JP | 4675996 | 4/2011 |
| JP | 4956598 | 6/2012 |
| JP | 2012-191184 | 10/2012 |
| JP | 2013-197396 | 9/2013 |
| JP | 2014-33094 | 2/2014 |
| JP | 5457961 | 4/2014 |
| JP | 2014-78714 | 5/2014 |
| JP | 2014-103373 | 6/2014 |
| JP | 2014-513873 | 6/2014 |
| JP | 5536039 | 7/2014 |
| JP | 5595977 | 9/2014 |
| JP | 2015-103271 | 6/2015 |
| JP | 2015-106708 | 6/2015 |
| JP | 5897433 | 3/2016 |
| JP | 5999768 | 9/2016 |
| JP | 2016-192478 | 11/2016 |
| JP | 2016-192514 | 11/2016 |

\* cited by examiner

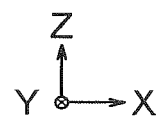
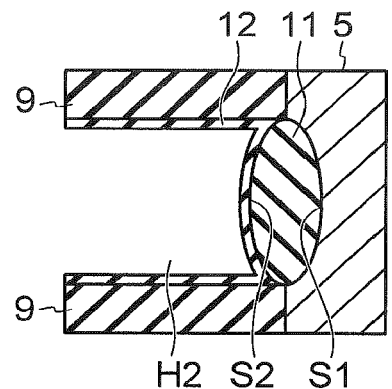
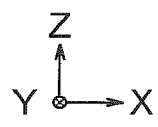
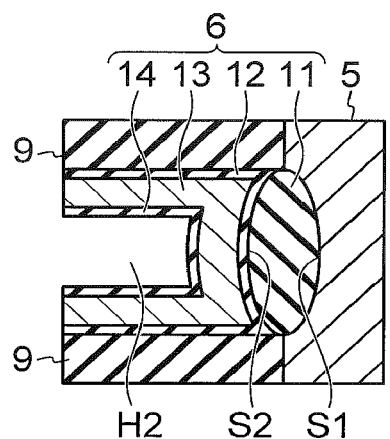
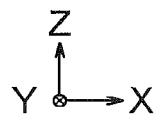
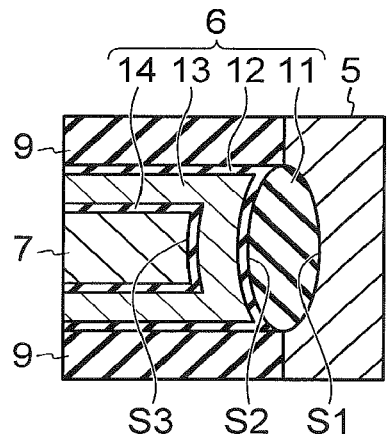

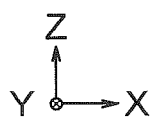
FIG. 13A
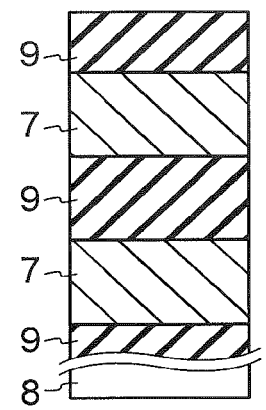
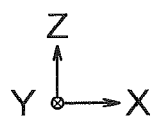
FIG. 13B
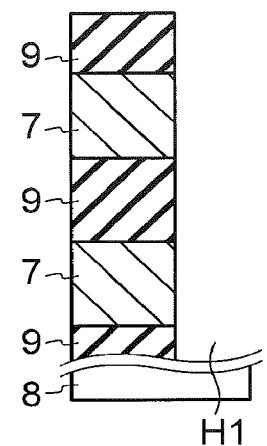
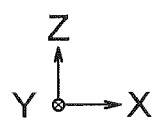
FIG. 13C
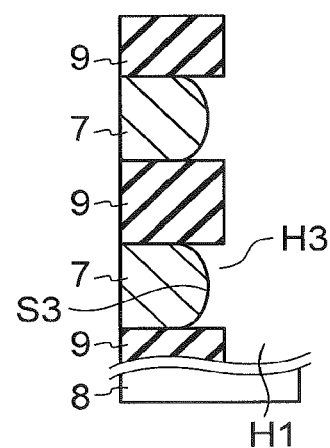

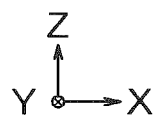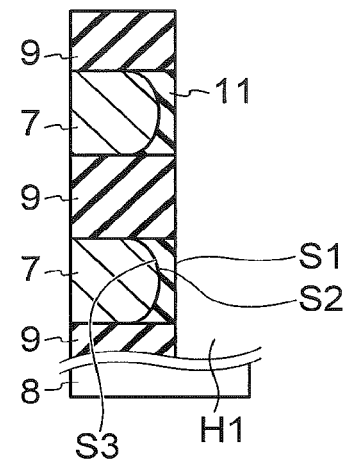
FIG. 14A
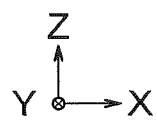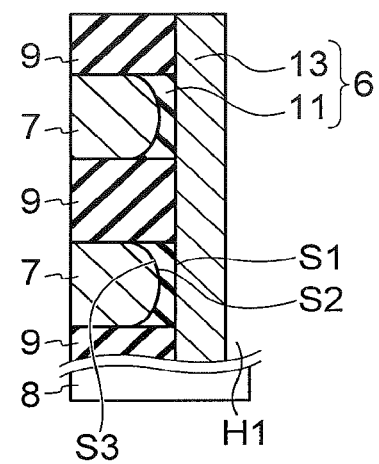
FIG. 14B
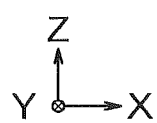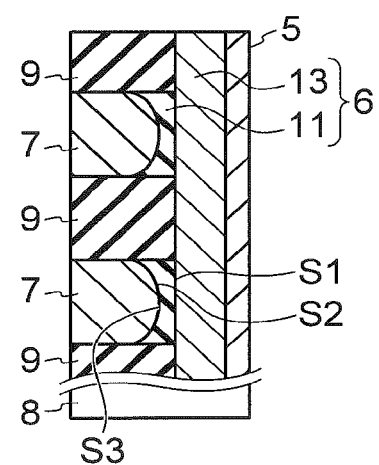
FIG. 14C

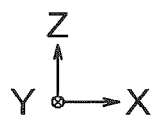
FIG. 15A
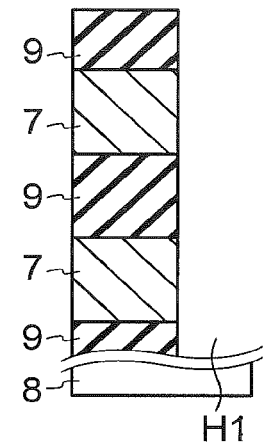
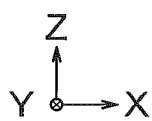
FIG. 15B
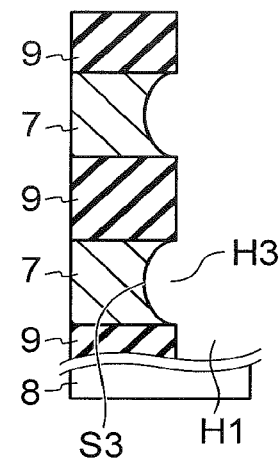
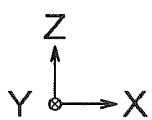
FIG. 15C
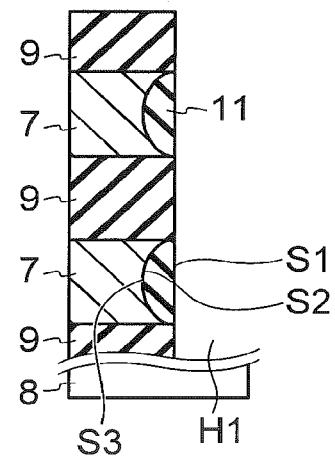

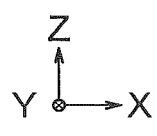
FIG. 27A
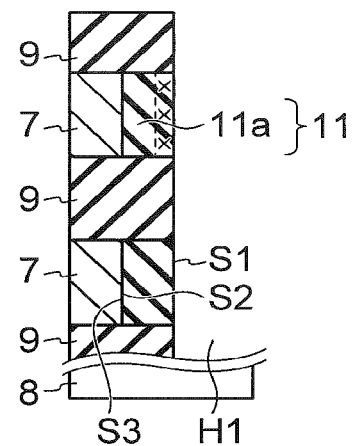
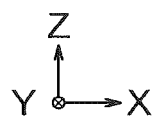
FIG. 27B
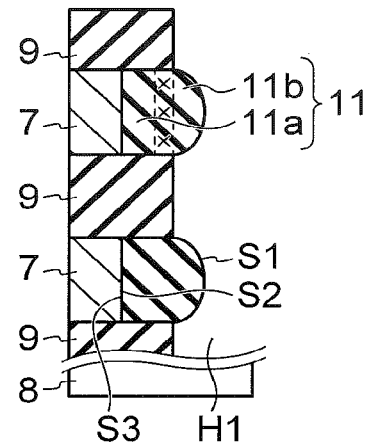
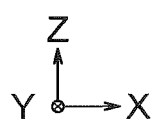
FIG. 27C
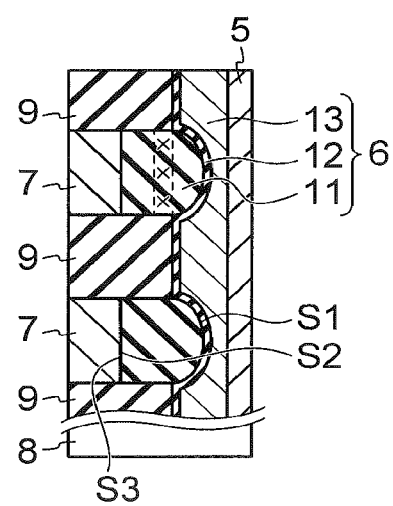

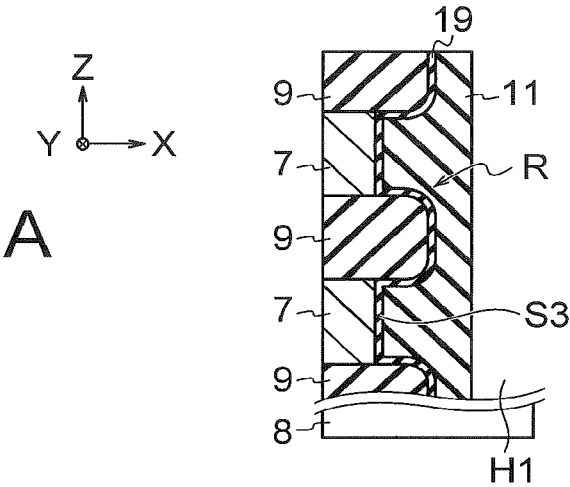
FIG. 29A
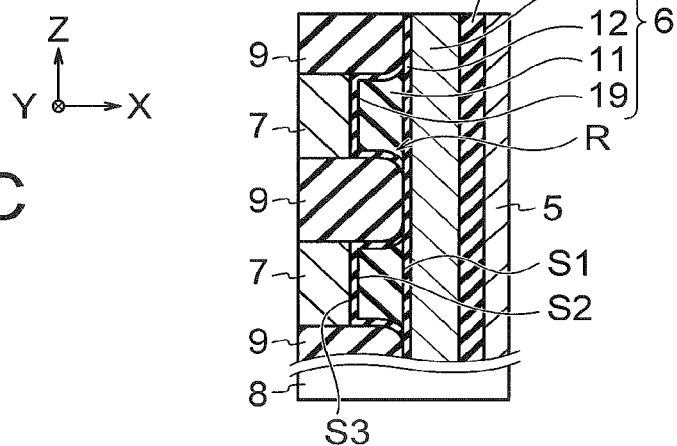
FIG. 29B
FIG. 29C

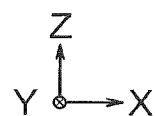
FIG. 35A
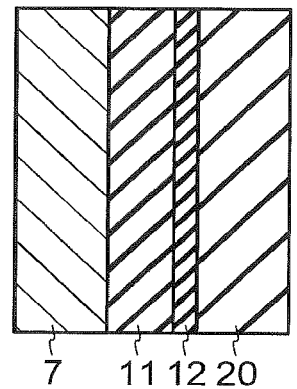
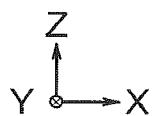
FIG. 35B
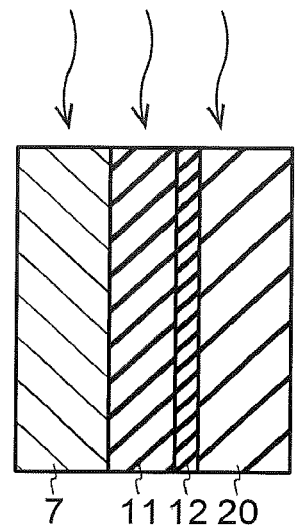
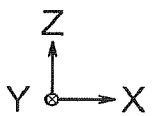
FIG. 35C
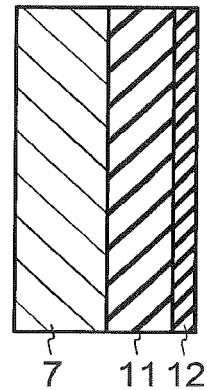

SEMICONDUCTOR STORAGE DEVICE COMPRISING RESISTANCE CHANGE FILM AND METHOD OF MANUFACTURING THE SAME

CROSS REFERENCE TO RELATED APPLICATION

This application is based upon and claims the benefit of priority from the prior Japanese Patent Application No. 2017-139387, filed on Jul. 18, 2017, the entire contents of which are incorporated herein by reference.

FIELD

Embodiments described herein relate to a semiconductor storage device and a method of manufacturing the same.

BACKGROUND

A resistive random access memory (ReRAM) has a problem that an operation voltage needed for the resistance change of a ReRAM cell is high in setting operation and in resetting operation. In order to apply a high voltage to the ReRAM cell, it is needed to set the area of a peripheral circuit to be wide, which causes costs of the ReRAM to increase. Such a high voltage applied to the ReRAM cell can also cause problems of breakage of a resistance change film and a leak current between word lines.

BRIEF DESCRIPTION OF THE DRAWINGS

FIGS. 5A to 6C are cross-sectional views showing a method of manufacturing the semiconductor storage device of the first embodiment;

FIGS. 13A to 14C are cross-sectional views showing a method of manufacturing the semiconductor storage device of the second embodiment;

FIGS. 15A to 15C are cross-sectional views showing a method of manufacturing the semiconductor storage device according to the modification of the second embodiment;

FIGS. 27A to 27C are cross-sectional views showing a method of manufacturing a semiconductor storage device according to a modification of the third embodiment;

FIGS. 29A to 29C are cross-sectional views showing a method of manufacturing a semiconductor storage device according to another modification of the third embodiment;

FIGS. 35A to 35C are cross-sectional views showing a method of manufacturing a semiconductor storage device of a fifth embodiment.

DETAILED DESCRIPTION

Embodiments will now be explained with reference to the accompanying drawings. In FIGS. 1 to 35C, the same or similar configurations are given the same signs, and their duplicated description is omitted.

In one embodiment, a semiconductor storage device includes a first interconnect extending in a first direction, a plurality of second interconnects extending in a second direction different from the first direction, and a plurality of first insulators provided alternately with the second interconnects. The device further includes a resistance change film provided between the first interconnect and at least one of the second interconnects and including a first metal layer or a first semiconductor layer that includes a first face provided on a first interconnect side and a second face provided on a second interconnect side, at least any of the first face and the second face having a curved plane shape.

(First Embodiment)

Figure 1:
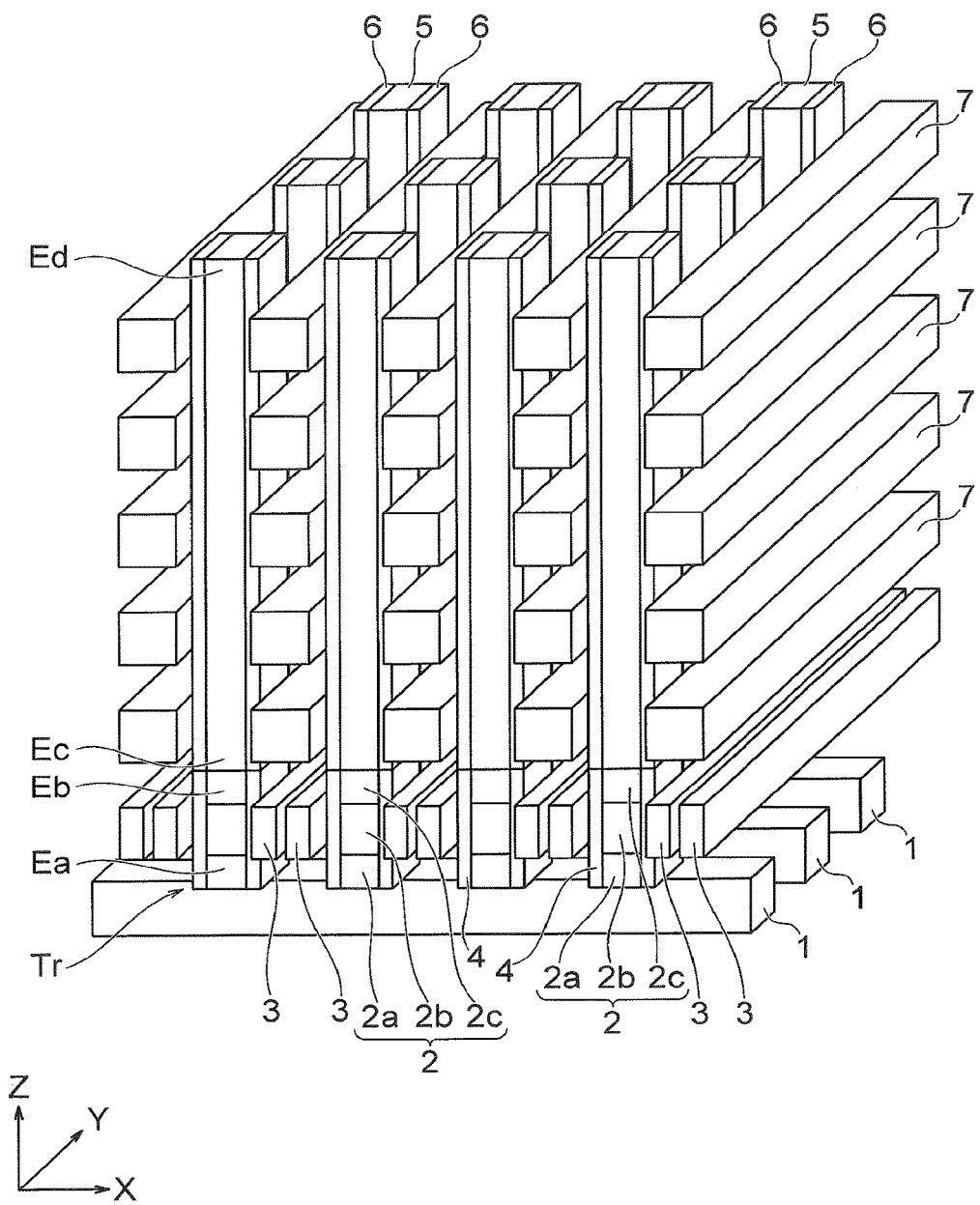
FIG. 1 is a perspective view showing a structure of a semiconductor storage device of a first embodiment.

FIG. 1 is a perspective view showing a structure of a semiconductor storage device of a first embodiment. The semiconductor storage device in FIG. 1 is a ReRAM.

The semiconductor storage device in FIG. 1 includes a plurality of global bit lines 1. These global bit lines 1 may be formed, for example, of portions of a silicon substrate, or may be formed of a polysilicon layer provided on the silicon substrate via an insulator. In the former case, isolation insulators are formed between the global bit lines 1.

FIG. 1 shows an X-direction and a Y-direction which are parallel to a surface of the substrate and perpendicular to each other, and a Z-direction perpendicular to the surface of the substrate. The global bit lines 1 extend in the X-direction and are adjacent to one another in the Y-direction. In the specification, the +Z-direction is handled as the upward direction, and the −Z-direction is handled as the downward direction. The −Z-direction may coincide with the direction of gravity or may not coincide therewith.

On each global bit line 1, a plurality of semiconductor members 2 are formed. These semiconductor members 2 are arranged into a matrix along the X-direction and the Y-direction. Signs Ea and Eb designate a lower end and an upper end of each semiconductor member 2, respectively. The lower end Ea of each semiconductor member 2 is electrically connected to one global bit line 1.

Each semiconductor member 2 includes an n-type portion 2a formed on one global bit line 1, a p-type portion 2b formed on the n-type portion 2a, and an n-type portion 2c formed on the p-type portion 2b. The n-type portion 2a, the p-type portion 2b and the n-type portion 2c are formed, for example, of polysilicon layers. In the embodiment, the n-type portions 2a and 2c may be replaced by p-type portions and the p-type portion 2b may be replaced by an n-type portion.

The semiconductor storage device in FIG. 1 further includes a plurality of gate electrodes 3 extending between the semiconductor members 2 in the Y-direction. These gate electrodes 3 are formed, for example, of polysilicon layers. Each gate electrode 3 is provided, via a gate insulator 4, on a +X-directional lateral face or a −X-directional lateral face of an upper portion of the n-type portion 2a, the entirety of the p-type portion 2b, and a lower portion of the n-type portion 2c.

Gate insulators 4 are formed on a +X-directional lateral face and a −X-directional lateral face of each semiconductor member 2. The gate insulators 4 are, for example, silicon oxide films. One semiconductor member 2, a pair of gate electrodes 3, and the gate insulator 4 between these constitute an n-channel thin film transistor (TFT), which is indicated by sign Tr. This TFT is a switching element switching a current between its conduction and its cutoff.

One local bit line 5 having a pillar shape extending in the Z-direction is formed on each semiconductor member 2. The local bit line 5 is formed, for example, of a titanium nitride film (TiN). Signs Ec and Ed designate a lower end and an upper end of each local bit line 5, respectively. The lower end Ec of each local bit line 5 is electrically connected to the upper end Eb of one semiconductor member 2. The local bit line 5 is exemplarily a first interconnect. The Z-direction is exemplarily a first direction.

Resistance change films 6 are formed on a +X-directional lateral face and a −X-directional lateral face of each local bit line 5. The resistance change film 6 is a film whose resistance state changes depending on a supplied voltage or current. Details of materials and shapes of the resistance change films 6 are mentioned later.

The semiconductor storage device in FIG. 1 further includes a plurality of word lines 7 extending between the local bit lines 5 in the Y-direction. The plurality of word lines 7 that are adjacent to one another in the Z-direction are disposed between the local bit lines 5 that are adjacent to each other in the X-direction. The word lines 7 are formed, for example, of titanium nitride films (TiN). The resistance change film 6 is formed between the local bit line 5 and the word line 7. The word line 7 is exemplarily a second interconnect. The Y-direction is exemplarily a second direction.

Figure 2:
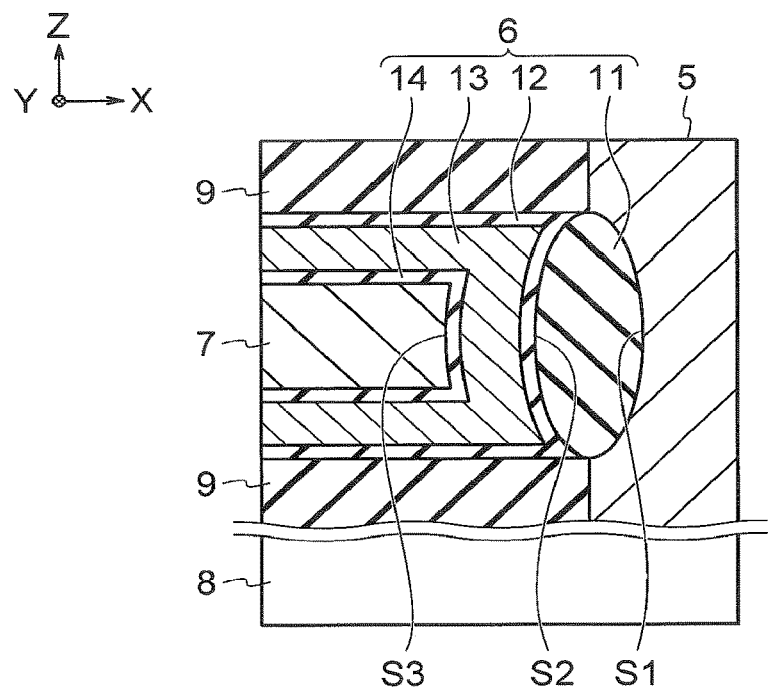
FIG. 2 is a cross-sectional view showing the structure of the semiconductor storage device of the first embodiment.

FIG. 2 is a cross-sectional view showing the structure of the semiconductor storage device of the first embodiment.

FIG. 2 shows a substrate 8, a portion of a plurality of inter layer dielectrics 9 and a plurality of word lines 7 which are alternately stacked above the substrate 8, and the local bit line 5 disposed, via the resistance change film 6, on lateral faces of the inter layer dielectric 9 and the word line 7. FIG. 2 exemplarily shows two layers of the plurality of inter layer dielectrics 9, and one of the plurality of word lines 7. The inter layer dielectric 9 is exemplarily a first insulator. FIG. 2 shows a cross section of one memory cell (ReRAM cell) formed in a crossing portion of one local bit line 5 and one word line 7. The inter layer dielectrics 9 are, for example, silicon oxide films ($SiO_2$). The substrate 8 is, for example, a semiconductor substrate such as a silicon substrate.

As shown in FIG. 2, the resistance change film 6 includes a switching layer 11, a first barrier layer 12, a second barrier layer 13 and a third barrier layer 14 which are sequentially provided between the local bit line 5 and the word line 7.

The switching layer 11 is formed of a material which is relatively high in conductivity and is relatively narrow in bandgap. The switching layer 11 is, for example, a metal oxide film such as a titanium oxide film ($TiO_X$). The switching layer 11 of the embodiment has a first lateral face S1 provided on the local bit line 5 side, and a second lateral face S2 provided on the word line 7 side. Both of the first lateral face S1 and the second lateral face S2 have curved plane shapes. The switching layer 11 is exemplarily a first metal layer. The first lateral face S1 and the second lateral face S2 are exemplarily a first face and a second face, respectively.

Specifically, the first lateral face S1 has a convex shape protruding to the local bit line 5 side. The second lateral face S2 has a convex shape protruding to the word line 7 side. Therefore, the switching layer 11 has a convex lens-shaped lens shape. In the embodiment, a curvature of the first lateral face S1 is set to be approximately the same as a curvature of the second lateral face S2.

The first to third barrier layers 12 to 14 are sequentially provided in an upper portion on the word line 7, in a lower portion on the word line 7, and between the local bit line 5 and the word line 7. The first barrier layer 12 is, for example, a metal oxide film such as an aluminum oxide film ($AlO_X$). The second barrier layer 13 is, for example, a semiconductor layer such as an amorphous silicon layer. The third barrier layer 14 is, for example, a non-metal oxide film such as a silicon oxide film ($SiO_2$). The second barrier layer 13 is exemplarily a first semiconductor layer. The first and third barrier layers 12 and 14 of the embodiment are formed of materials which are lower in conductivity and wider in bandgap than the material of the switching layer 11.

Similarly to the switching layer 11, each of the first to third barrier layers 12 to 14 also has a first lateral face provided on the local bit line 5 side, and a second lateral face provided on the word line 7 side. Both of the first lateral face and the second lateral face have curved plane shapes. It should be noted that the relevant first lateral face has a concave shape recessed from the local bit line 5 side, and that the relevant second lateral face has a convex shape protruding to the word line 7 side.

The word line 7 is provided between the inter layer dielectrics 9 adjacent to each other via the first to third barrier layers 12 to 14. Note that, in the embodiment, the switching layer 11, the first barrier layer 12, the second barrier layer 13 and the third barrier layer 14 are separated for each word line 7. The word line 7 of the embodiment has a lateral face S3 which is provided on the local bit line 5 side and has a curved plane shape. Specifically, the lateral face S3 has a concave shape recessed from the local bit line 5 side. The lateral face S3 is exemplarily a third face.

Upon application of a voltage to the resistance change film 6, oxygen ions are introduced from the first to third barrier layers 12 to 14 into the switching layer 11. As a result, a band structure of the resistance change film 6 changes, and the resistance state of the resistance change film 6 changes. It is estimated that a region where the resistance state mainly changes is located in the vicinity of the first barrier layer 12 and in the switching layer 11.

Figure 3:
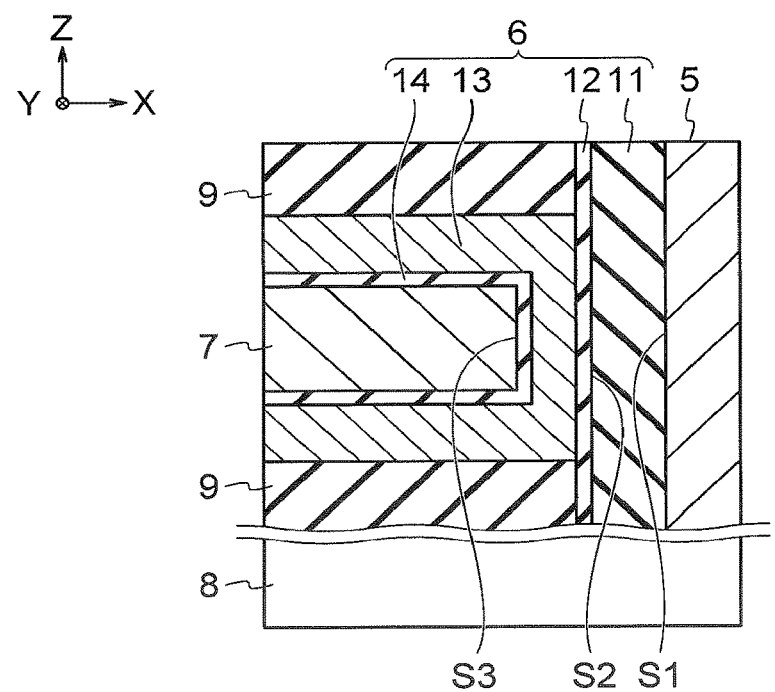
FIG. 3 is a cross-sectional view showing a structure of a semiconductor storage device according to a comparative example of the first embodiment.

FIG. 3 is a cross-sectional view showing a structure of a semiconductor storage device according to a comparative example of the first embodiment.

The switching layer 11 and the first barrier layer 12 of the comparative example are not separated for each word line 7 but commonly provided to the lateral faces S3 of the plurality of word lines 7. Meanwhile, the second barrier layer 13 and the third barrier layer 14 of the comparative example are separated for each word line 7. In the comparative example, all of the first lateral face S1 and the second lateral face S2 of the switching layer 11 and the lateral face S3 of the word line 7 have planar shapes.

Figure 4A:
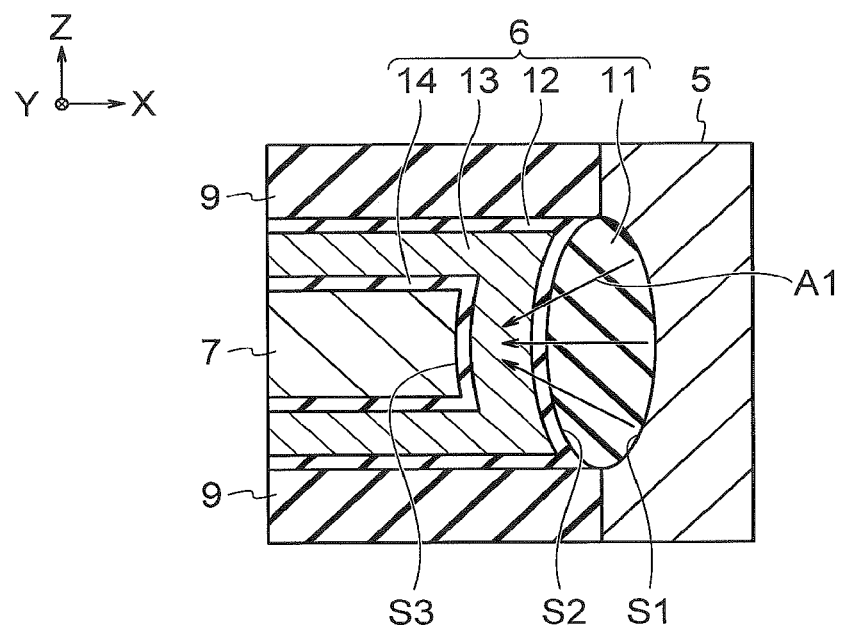
FIGS. 4A and 4B are cross-sectional views for explaining functions of the semiconductor storage device of the first embodiment.
Figure 4B:
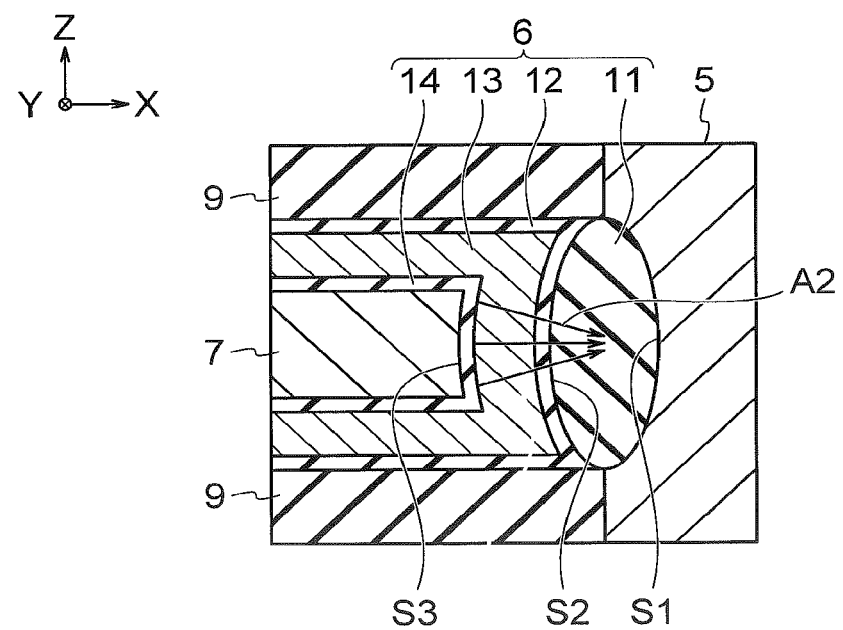

FIGS. 4A and 4B are cross-sectional views for explaining a function of the semiconductor storage device of the first embodiment.

Arrows A1 in FIG. 4A exemplarily indicate lines of electric force generated in a memory cell in setting operation. In the embodiment, since the first lateral face S1 and the second lateral face S2 of the switching layer 11 have the convex shapes, concentration of an electric field arises as indicated by the arrows A1. Therefore, an operation voltage needed for resistance change in the memory cell in setting operation can be reduced.

Arrows A2 in FIG. 4B exemplarily indicate lines of electric force generated in the memory cell in resetting operation. In the embodiment, since the lateral face S3 of the word line 14 has the concave shape, concentration of an electric field arises as indicated by the arrows A2. Therefore, an operation voltage needed for resistance change in the memory cell in resetting operation can be reduced.

Moreover, since the switching layer 11 of the embodiment is separated for each word line 7, a current can be suppressed from flowing from a certain word line 7 to another word line 7 via the switching layer 11. Therefore, according to the embodiment, a leak current between the word lines 7 can be reduced.

FIGS. 5A to 6C are cross-sectional views showing a method of manufacturing the semiconductor storage device of the first embodiment.

Figure 5A:
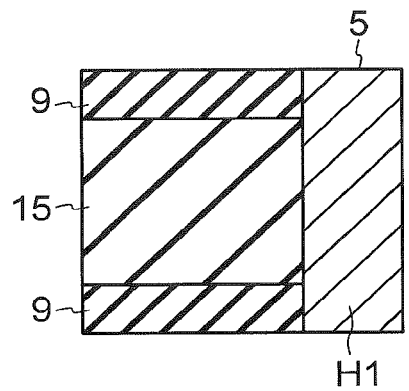

First, the plurality of inter layer dielectrics 9 and a plurality of sacrificial films 15 are alternately stacked on the substrate 8 (see FIG. 2) (FIG. 5A). The inter layer dielectric 9 is, for example, a silicon oxide film having 30 nm of film thickness. It is formed by chemical vapor deposition (CVD) using tetraethyl orthosilicate (TEOS) at 300 to 700° C. in a reduced pressure environment (at or below approximately 2000 Pa). The sacrificial film 15 is, for example, a silicon nitride film (SiN) having 30 nm of film thickness. It is formed by CVD using $SiH_4$ gas and $NH_3$ gas at 300 to 700° C. in a reduced pressure environment (at or below approximately 2000 Pa) (H represents hydrogen). The sacrificial film 15 is exemplarily the first film.

Next, by lithography and reactive ion etching (RIE), an opening H1 which penetrates a stacked structure of the inter layer dielectrics 9 and the sacrificial films 15 is formed, and in the opening H1, the local bit line 5 is formed (FIG. 5A). The lithography and the RIE are performed with a hard mask layer (for example, a polysilicon layer) formed between the aforementioned stacked structure and a resist film. Removal of the resist film is performed by ashing, and a post-process after that is performed by wet etching using diluted hydrofluoric acid. The local bit line 5 is, for example, a titanium nitride film having 20 nm of film thickness. It is formed by CVD using $TiCl_4$ gas and $NH_3$ gas at or below 700° C. and 1000 Pa (Cl represents chlorine). The local bit line 5 is formed so as to be electrically connected to a TFT (see FIG. 1).

Figure 5B:
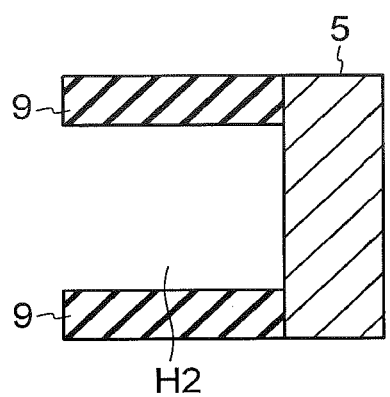

Next, a space for removing the sacrificial film 15 is formed in the aforementioned stacked structure, and the sacrificial film 15 is removed using this space (FIG. 5B). As a result, a plurality of cavities H2 are formed between the inter layer dielectrics 9. FIG. 5B shows one of such cavities H2. The sacrificial films 15 are removed, for example, by wet etching using hot phosphoric acid. Thereby, the sacrificial films 15 can be selectively removed out of the sacrificial films 15 and the inter layer dielectrics 9.

Figure 5C:
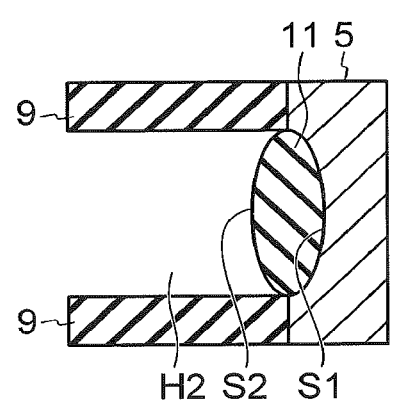

Next, a lateral face of the local bit line 5 exposed toward the cavity H2 undergoes thermal oxidation with oxygen at 300 to 900° C. in a reduced pressure environment at or below 95000 Pa (FIG. 5C). As a result, the switching layer 11 which has the first lateral face S1 protruding to the local bit line 5 side and the second lateral face S2 protruding to the cavity H2 side is formed on the lateral face of the local bit line 5. The switching layer 11 is, for example, a titanium oxide film having 10 nm of film thickness. Since approximately two-fold volume expansion arises when the switching layer 11 is formed through oxidation of portion of the local bit line 5, both of the first lateral face S1 and the second lateral face S2 become to have convex shapes.

Next, the first barrier layer 12 is formed on the upper face of the cavity H2 (the lower face of the inter layer dielectric 9 exposed toward the cavity H2), the lower face of the cavity H2 (the upper face of the inter layer dielectric 9 exposed toward the cavity H2), and the second lateral face S2 of the switching layer 11 (FIG. 6A). The first barrier layer 12 is, for example, an aluminum oxide film having 1 nm of film thickness. It is formed by atomic layer deposition (ALD) using trimethylalmuminum (TMA) and ozone ($O_3$).

Next, the second barrier layer 13 and the third barrier layer 14 are further formed on the upper face of the cavity H2, the lower face of the cavity H2, and the second lateral face S2 of the switching layer 11 (FIG. 6B). The second barrier layer 13 is, for example, an amorphous silicon layer having 5 nm of film thickness. It is formed by CVD using $Si_2H_6$ gas at 350 to 600° C. The third barrier layer 14 is, for example, a silicon oxide film, and is formed as a natively oxidized film on the surface of the amorphous silicon layer. As above, the resistance change film 6 is formed on the upper face of the cavity H2, the lower face of the cavity H2, and the lateral face of the local bit line 5.

Next, the word line 7 is formed in the cavity H2 via the resistance change film 6 (FIG. 6C). As mentioned above, the word line 7 may be a titanium nitride film or may be a stacked film including a titanium nitride film and a tungsten (W) layer. In the latter case, the word line 7 is formed, for example, by forming the titanium nitride film having 5 nm of film thickness through CVD using $TiCl_4$ gas and $NH_3$ gas at or below 700° C. and 1000 Pa, and after that, forming the tungsten layer using $WF_6$ gas and $SiH_4$ gas. As above, the memory cell shown in FIG. 2 is formed.

The oxidation for forming the switching layer 11 may be performed using an oxidizing agent other than oxygen. Examples of such an oxidizing agent include $N_2O$ gas, NO gas, $O_3$ gas), $H_2O$ gas and a mixture gas containing $H_2$ gas and $O_2$ gas. Moreover, in place of thermal oxidation, low temperature oxidation using plasma and radicals at or below 500° C. may be performed. Moreover, additional annealing may be performed in order to improve crystallinity of the switching layer 11. In this case, the annealing may be performed in inert gas such as $N_2$ gas, or may be performed in a reducing agent such as $H_2$ gas, or may be performed in an oxidizing agent such as $O_2$ gas.

The first barrier layer 12 may be formed using materials other than TMA and $O_3$. For example, in place of TMA, $AlCl_3$ may be used, and in place of $O_3$, $H_2O$ may be used. Moreover, the second barrier layer 13 may be formed using a silicon source other than $Si_2H_6$. For example, as the silicon source, aminosilane-based gas may be used or $Si_2H_6$ gas and $SiH_4$ gas may be used.

Moreover, four or more barrier layers constituting the resistance change film 6 may be employed, or one or two of those may be employed. For example, the resistance change film 6 may not include the third barrier layer 14. Moreover, in the case where the resistance change film 6 is constituted of the switching layer 11 and a single barrier layer, a hafnium oxide film ($HfO_X$) or a zirconium oxide film ($ZrO_X$) may be used as the barrier layer. An arrangement of the switching layer 11, the first barrier layer 12, the second barrier layer 13 and the third barrier layer 14 is not limited to the aforementioned arrangement. For example, the position of the switching layer 11 and the position of the second barrier layer 13 may be exchanged.

Moreover, the local bit line 5 may be a metal layer other than a titanium nitride film (TiN) and may be, for example, a titanium layer (Ti) or a tantalum nitride film (TaN). In the latter case, the switching layer 11 is a tantalum oxide film ($TaO_X$). The tantalum oxide film causes resistance change similarly to the titanium oxide film, and hence, can function as the switching layer 11. The switching layer 11 may employ any material other than a titanium oxide film and a tantalum oxide film as long as it can function as the switching layer 11.

Figure 7A:
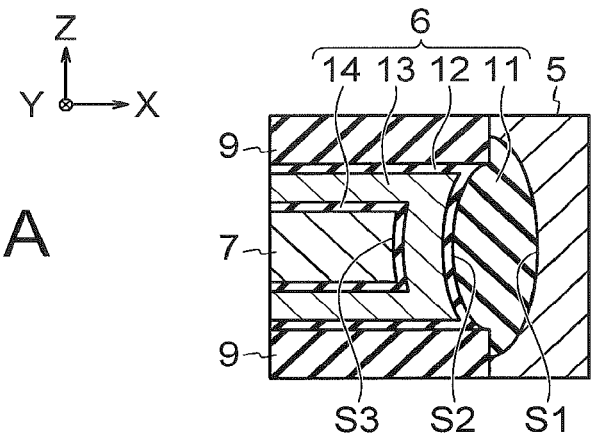
FIGS. 7A to 7C are cross-sectional views showing structures of semiconductor storage devices according to modifications of the first embodiment.
Figure 7B:
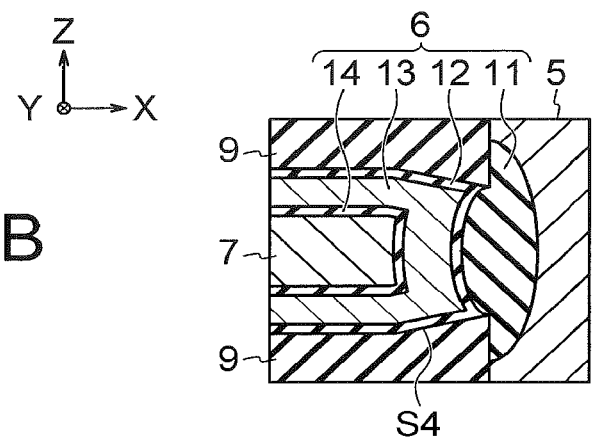
Figure 7C:
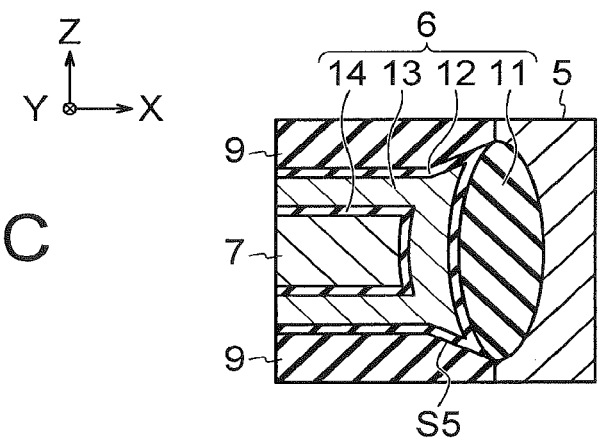

FIGS. 7A to 7C are cross-sectional views showing structures of semiconductor storage devices according to modifications of the first embodiment.

FIG. 7A shows an example in which the first lateral face S1 is wider than the second lateral face S2 due to the oxidizing agent for forming the switching layer 11 diffusing through the inter layer dielectric 9. In FIG. 7A, the upper end of the first lateral face S1 is higher than the upper end of the second lateral face S2, and the lower end of the first lateral face S1 is higher than the lower end of the second lateral face S2. As a result, the curvature of the first lateral face S1 is different from the curvature of the second lateral face S2. Such a configuration has an advantage that operation voltage of a memory cell is further reduced due to a wider first lateral face S1 leading to an increased capacitance of the switching layer 11.

FIG. 7B shows an example in which a residue of the sacrificial film 15 remains near the local bit line 5 when removing the sacrificial film 15. In this case, as indicated by sign S4, the upper face and the lower face of the inter layer dielectric 9 (more correctly, the inter layer dielectric 9 and the sacrificial film 15) are to have a tapered shape near the local bit line 5. Specifically, the height of the upper face becomes lower as coming closer to the local bit line 5, and the height of the lower face becomes higher as coming closer to the local bit line 5. The residue of the sacrificial film 15 is oxidized to change into a silicon oxide film when the switching layer 11 is formed by oxidation. In FIG. 7B, operation voltage of a memory cell is further reduced due to the area ratio of the first lateral face S1 relative to the second lateral face S2 becoming larger.

Similarly to FIG. 7B, in FIG. 7C, as indicated by sign S5, the upper face and the lower face of the inter layer dielectric 9 have a tapered shape near the local bit line 5. It should be noted that in FIG. 7B, the height of the upper face becomes higher as coming closer to the local bit line 5, and the height of the lower face becomes lower as coming closer to the local bit line 5. Such a configuration has an advantage that overexpansion of the switching layer 11 can be suppressed.

Figure 8:
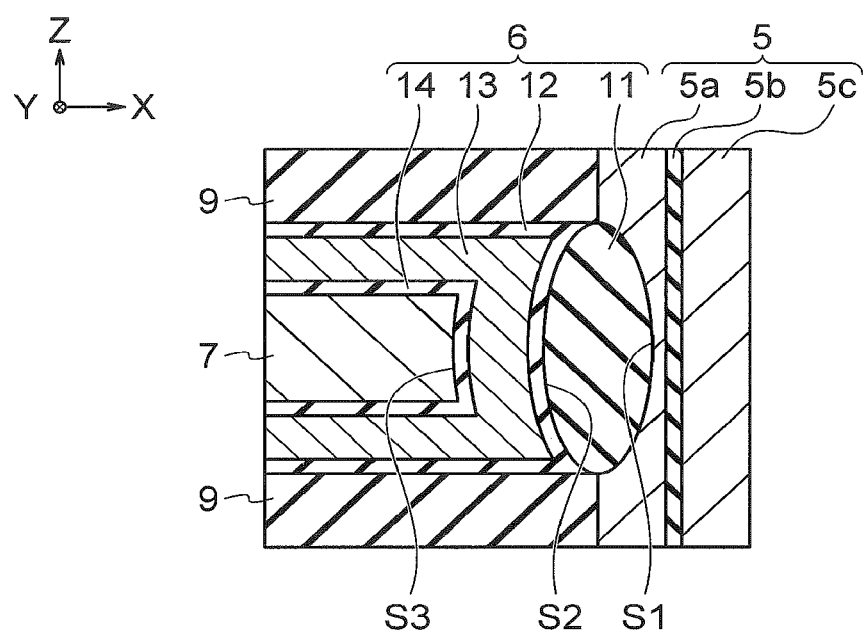
FIG. 8 is a cross-sectional view showing a structure of a semiconductor storage device according to another modification of the first embodiment.

FIG. 8 is a cross-sectional view showing a structure of a semiconductor storage device according to another modification of the first embodiment.

The local bit line 5 of the present modification includes a first interconnect layer 5a provided on the word line 7 side, a second interconnect layer 5c provided on the opposite side to the word line 7, and an intermediate insulator 5b provided between the first interconnect layer 5a and the second interconnect layer 5c.

The first and second interconnect layers 5a and 5c are, for example, titanium nitride films. The intermediate insulator 5b is, for example, a silicon nitride film. The intermediate insulator 5b of the present modification is provided in order to prevent the switching layer 11 from penetrating the local bit line 5 when the switching layer 11 is formed. The intermediate insulator 5b may be in contact with the switching layer 11 or may not be in contact with the switching layer 11. The intermediate insulator 5b is exemplarily a second insulator.

Figure 9A:
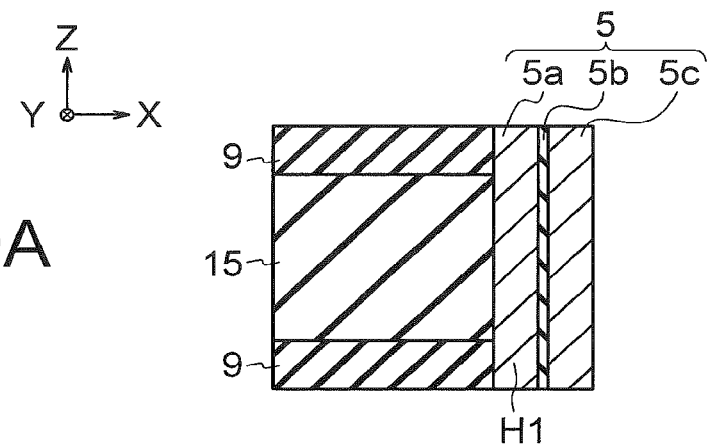
FIGS. 9A to 9C are cross-sectional views showing a method of manufacturing the semiconductor storage device shown in FIG. 8.
Figure 9B:
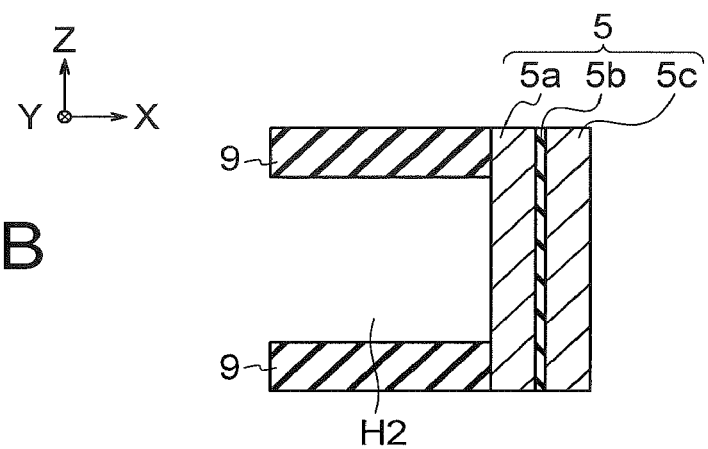
Figure 9C:
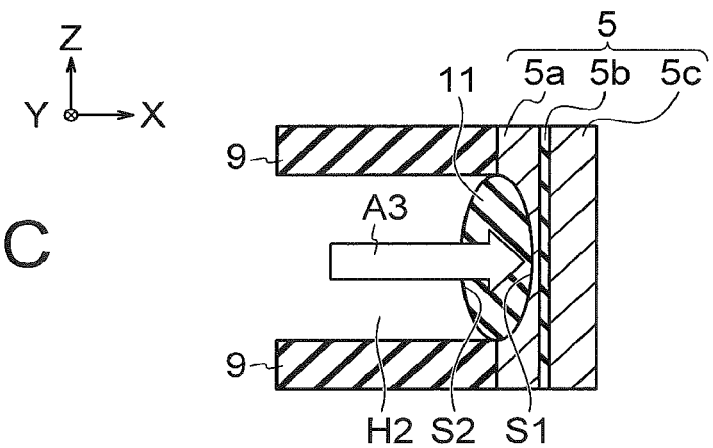

FIGS. 9A to 9C are cross-sectional views showing a method of manufacturing the semiconductor storage device shown in FIG. 8.

First, similarly to the process in FIG. 5A, the plurality of inter layer dielectrics 9 and the plurality of sacrificial films 15 are alternately stacked on the substrate 8 (see FIG. 2) (FIG. 9A). Next, the opening H1 which penetrates the stacked structure of the inter layer dielectrics 9 and the sacrificial films 15 is formed, and the local bit line 5 is formed in the opening H1 (FIG. 9A). The local bit line 5 is formed by sequentially forming the first interconnect layer 5a, the intermediate insulator 5b and the second interconnect layer 5c in the opening H1.

The intermediate insulator 5b of the present modification is formed by forming a silicon nitride film in the middle of forming a titanium nitride film. In this case, a titanium nitride film formed before the formation of the silicon nitride film is the first interconnect layer 5a, and a titanium nitride film formed after the formation of the silicon nitride film is the second interconnect layer 5c. The intermediate insulator 5*b* is formed, for example, by ALD using $SiH_2Cl_2$ gas and $NH_3$ gas in a reduced pressure environment at or below 2000 Pa. The intermediate insulator 5*b* may be formed using other source gas. For example, in place of the $SiH_2Cl_2$ gas, $SiH_4$ gas or $Si_2H_6$ gas may be used, and in place of the $NH_3$ gas, $N_2$ radicals may be used.

Next, the sacrificial film 15 is removed by wet etching (FIG. 9B). As a result, the plurality of cavities H2 are formed between the inter layer dielectrics 9.

Next, the lateral face of the local bit line 5 exposed toward the cavity H2 undergoes thermal oxidation (FIG. 9C). As a result, the switching layer 11 having the first lateral face S1 protruding to the local bit line 5 side and the second lateral face S2 protruding to the cavity H2 side is formed on the lateral face of the local bit line 5. In this stage, diffusion of the oxidizing agent for the thermal oxidation is suppressed by the intermediate insulator 5*b* as indicated by an arrow A3. Thereby, the switching layer 11 can be prevented from penetrating the local bit line 5.

Although the intermediate insulator 5*b* is effective for prevention of penetration of the switching layer 11, it makes the electric resistance of the local bit line 5 increase. Therefore, the film thickness of the intermediate insulator 5*b* is desirable to be set to be small in order not to largely increase the electric resistance of the local bit line 5. The film thickness of the intermediate insulator 5*b* is set to be, for example, 1 nm or less.

As above, the first lateral face S1 and the second lateral face S2 of the switching layer 11 of the present embodiment have convex shapes. Therefore, according to the present embodiment, operation voltage needed for resistance change of a ReRAM cell in setting operation and in resetting operation can be reduced (see FIG. 4A and FIG. 4B). The ReRAM cell can be operated at low voltage. As a result, the area of a peripheral circuit is not needed to be set large in order to apply high voltage to the ReRAM cell, which enables a semiconductor storage device (ReRAM) high in quality and low in costs to be realized.

Moreover, the inter layer dielectrics 9 are also reformed by the oxidation when the switching layer 11 is formed by oxidation. Thereby, insulation characteristics of the inter layer dielectrics 9 can be improved, and sufficient insulation characteristics thereof can be secured even when the inter layer dielectrics 9 are made thin.

Moreover, in the present embodiment, employing the structure in FIG. 8 enables the switching layer 11 to be prevented from penetrating the local bit line 5. The titanium nitride film, which is the main material of the local bit line 5, has a prismatic crystal structure, and its oxidation proceeds more at grain boundary portions, in which a diffusion rate of the oxidizing agent is higher. Therefore, since there is a high possibility that the switching layer 11 penetrates the local bit line 5, the structure in FIG. 8 is significantly useful. Moreover, since when the structure in FIG. 8 is employed, the local bit line 5 can be sufficiently oxidized for forming the switching layer 11, nitrogen eliminated from the local bit line 5 can be sufficiently oxidized. Therefore, nitrogen remaining in the switching layer 11 as an impurity can be reduced, which can improve film quality of the switching layer 11.

(Second Embodiment)

Figure 10:
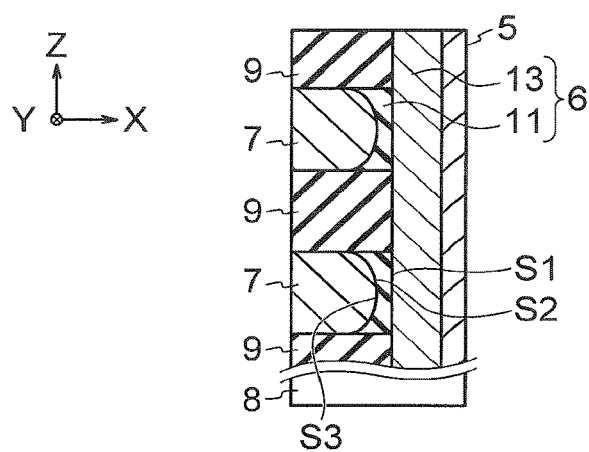
FIG. 10 is a cross-sectional view showing a structure of a semiconductor storage device of a second embodiment.

FIG. 10 is a cross-sectional view showing a structure of a semiconductor storage device of a second embodiment.

In the present embodiment, the lateral face S3 of the word line 7 has a convex shape protruding to the local bit line 5 side. Moreover, the resistance change film 6 includes the switching layer 11 and the second barrier layer 13 which are sequentially provided on the lateral face S3 of the word line 7. The switching layer 11 is, for example, a titanium oxide film. The second barrier layer 13 is, for example, an amorphous silicon layer. The first lateral face S1 of the switching layer 11 has a planar shape. The second lateral face S2 of the switching layer 11 has a concave shape recessed from the word line 7 side. While the switching layer 11 is separated for each word line 7, the second barrier layer 13 is not separated for each word line 7 but commonly provided on the lateral faces S3 of the plurality of word lines 7.

Since the switching layer 11 of the present embodiment is separated for each word line 7, a current can be suppressed from a certain word line 7 to another word line 7 via the switching layers 11. Therefore, according to the present embodiment, a leak current between the word lines 7 can be reduced. Since the titanium oxide film constituting the switching layer 11 has a high dielectric constant, such a high dielectric constant also contributes the reduction of the leak current.

Moreover, the second lateral face S2 of the switching layer 11 of the present embodiment has a concave shape recessed from the word line 7 side. Therefore, the film thickness of the switching layer 11 is small at a middle portion between the upper face and the lower face of the inter layer dielectrics 9. Accordingly, an electric field tends to be applied to this middle portion, which enables a memory cell to operate at low voltage. As a result, effects of increase in readout current of the memory cell and suppression of operation delay can be obtained, which enables high speed operation of a semiconductor storage device.

Figure 11:
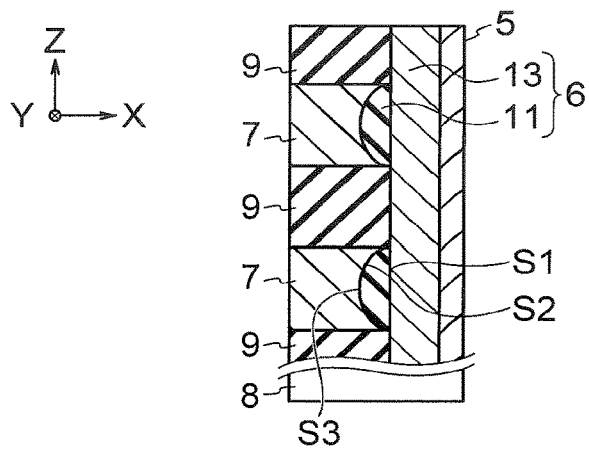
FIG. 11 is a cross-sectional view showing a structure of a semiconductor storage device according to a modification of the second embodiment.

FIG. 11 is a cross-sectional view showing a structure of a semiconductor storage device according to a modification of the second embodiment.

In the present modification, the lateral face S3 of the word line 7 has a concave shape recessed from the local bit line 5 side. Moreover, the first lateral face S1 of the switching layer 11 has a planar shape. The second lateral face S2 of the switching layer 11 has a convex shape protruding to the word line 7 side.

Since second lateral face S2 of the switching layer 11 of the present modification has the convex shape protruding to the word line 7 side, the film thickness of the switching layer 11 is large at a middle portion between the upper face and the lower face of the inter layer dielectrics 9. Accordingly, an electric field is hardly applied to this middle portion, which can suppress breakage of the switching layer 11. As a result, reliability of memory cells can be improved.

Figure 12:
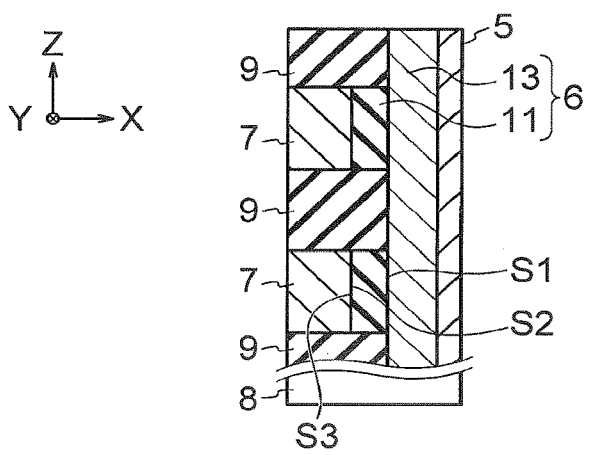
FIG. 12 is a cross-sectional view showing a structure of a semiconductor storage device according to a comparative example of the second embodiment.

FIG. 12 is a cross-sectional view showing a structure of a semiconductor storage device according to a comparative example of the second embodiment.

In the comparative example, all of the first lateral face S1 and the second lateral face S2 of the switching layer 11 and the lateral face S3 of the word line 7 have planar shapes. In this case, when a leak current is desired to be reduced, it can be considered to employ the structure in FIG. 10. Meanwhile, when breakage of the switching layer 11 is desired to be suppressed, it can be considered to employ the structure in FIG. 11.

FIGS. 13A to 14C are cross-sectional views showing a method of manufacturing a semiconductor storage device of the second embodiment.

First, the plurality of inter layer dielectrics 9 and a plurality of line material layers which are materials of the plurality of word lines 7 are alternately stacked on the substrate 8 (FIG. 13A). The inter layer dielectric 9 is, for example, a silicon oxide film having 15 nm of film thickness. It is formed by plasma CVD using $SiH_4$ gas and $N_2O$ gas at 200 to 500° C. The line material layer is, for example, a titanium nitride film having 15 nm of film thickness. It is formed by sputtering. Hereafter, the line material layer is expressed as "line material layer 7". The line material layer 7 is exemplarily a second film.

Next, the opening H1 which penetrates a stacked structure of the inter layer dielectrics 9 and the line material layers 7 is formed by lithography and RIE (FIG. 13B). The lithography and the RIE are performed with a hard mask layer (for example, a polysilicon layer) formed between the aforementioned stacked structure and a resist film.

Lateral faces of the line material layers 7 exposed toward the opening H1 are recessed by liquid chemical processing (FIG. 13C). As a result, a plurality of openings H3 are formed between the inter layer dielectrics 9, and the word lines 7 having the lateral faces S3 are formed from the line material layers 7.

In this stage, an etching rate of the line material layers 7 is high near the upper faces and the lower faces of the inter layer dielectrics 7 depending on a selection ratio of the liquid chemical, which increases a recessing amount. According to this, the shapes of the lateral faces S3 of the word lines 7 become convex. Such a selection ratio can be realized, for example, by setting each line material layer 7 to be a stacked film including a non-Ti-rich first titanium nitride film, a Ti-rich second titanium nitride film and a non-Ti-rich third titanium nitride film. When the composition of a titanium nitride film is represented by $Ti_XN_Y$, it is a Ti-rich titanium nitride film when X>Y, and it is a non-Ti-rich titanium nitride film when X=Y (or X<Y). Since a Ti-rich titanium nitride film is low in etching rate, the convex lateral face S3 can be obtained.

Next, the lateral faces S3 of the word lines 7 exposed toward the openings H3 undergo thermal oxidation with oxygen at 300 to 900° C. in a reduced pressure environment at or below 95000 Pa (FIG. 14A). As a result, the switching layer 11 which has the first lateral face S1 positioned on the local bit line 5 side and the second lateral face S2 recessed from the word line 7 side is formed on the lateral face S3 of the word line 7.

When each word line (line material layer) 7 is a stacked film including a non-Ti-rich first titanium nitride film, a Ti-rich second titanium nitride film and a non-Ti-rich third titanium nitride film, an oxidation rate of the word line 7 is low near the upper face and the lower face of the inter layer dielectric 7. Therefore, the shape of the lateral face S3 of each word line 7 changes into a gentler convex shape by the oxidation.

Moreover, depending on the conditions of oxidation, the oxidation rate of the word line 7 is high near the upper face and the lower face of the inter layer dielectric 7. In this case, the second lateral face S2 can be set to be concave even when the lateral face S3 is not processed to be convex in the process of FIG. 13C.

Meanwhile, the switching layer 11 may be formed by a method other than oxidation. For example, when the lateral face S3 is processed to be convex in the process of FIG. 13C, the switching layer 11 may be formed using TDMAT (tetra (dimethylamino)titanium) and $O_3$ (ozone).

Next, the second barrier layer 13 is formed on the surface of the opening H1 (FIG. 14B). As a result, the resistance change film 6 including the switching layer 11 and the second barrier layer 13 is formed. The second barrier layer 13 is, for example, an amorphous silicon layer having 5 nm of film thickness. It is formed by CVD using $Si_2H_6$ gas at 350 to 600° C.

Next, the local bit line 5 is formed in the opening H1 via the resistance change film 6 (FIG. 14C). The local bit line 5 is formed, for example, as follows. A titanium nitride film is formed by CVD using $TiCl_4$ gas and $NH_3$ gas at or below 1000 Pa and 700° C. In this titanium nitride film and the like, an opening for contact with a TFT (see FIG. 1) is formed by RIE. Then, a titanium nitride film is further formed by CVD using $TiCl_4$ gas and $NH_3$ gas at or below 1000 Pa and 700° C. As above, the memory cell shown in FIG. 10 is formed.

When the switching layer 11 is formed by oxidation, a titanium oxynitride film (TiON) is formed between the titanium nitride film constituting the word line 7 and the titanium oxide film constituting the switching layer 11. Thereby, a parasitic resistance of the memory cell is reduced, which enables the memory cell to operate at high speed.

FIGS. 15A to 15C are cross-sectional view showing a method of manufacturing a semiconductor storage device according to a modification of the second embodiment.

First, the plurality of inter layer dielectrics 9 and a plurality of line material layers which are materials of the plurality of word lines 7 are alternately stacked on the substrate 8 (FIG. 15A). Hereafter, the line material layer is expressed as "line material layer 7". Next, the opening H1 which penetrates the stacked structure of the inter layer dielectrics 9 and the line material layers 7 is formed (FIG. 15A).

Next, lateral faces of the line material layers 7 exposed toward the opening H1 are recessed by liquid chemical processing (FIG. 15B). As a result, the plurality of openings H3 are formed between the inter layer dielectrics 9, and the word lines 7 having the lateral faces S3 are formed from the line material layers 7.

In this stage, the etching rate of the line material layers 7 is low near the upper faces and the lower face of the inter layer dielectrics 7 depending on the selection ratio of the liquid chemical, which decreases the recessing amount. According to this, the shapes of the lateral faces S3 of the word lines 7 become concave. Such a selection ratio can be realized, for example, by setting each line material layer 7 to be a stacked film including a Ti-rich first titanium nitride film, a non-Ti-rich second titanium nitride film and a Ti-rich third titanium nitride film. Since a Ti-rich titanium nitride film is low in etching rate, the concave lateral face S3 can be obtained.

Next, the lateral faces S3 of the word lines 7 exposed toward the openings H3 undergo thermal oxidation (FIG. 15C). As a result, the switching layer 11 which has the first lateral face S1 positioned on the local bit line 5 side and the second lateral face S2 protruding to the word line 7 side is formed on the lateral face S3 of the word line 7.

When each word line (line material layer) 7 is a stacked film including a Ti-rich first titanium nitride film, a non-Ti-rich second titanium nitride film and a Ti-rich third titanium nitride film, the oxidation rate of the word line 7 is high near the upper face and the lower face of the inter layer dielectric 7. Therefore, the shape of the lateral face S3 of each word line 7 changes into a gentler concave shape.

Moreover, depending on the conditions of oxidation, the oxidation rate of the word line 7 is low near the upper face and the lower face of the inter layer dielectric 7. In this case, the second lateral face S2 can be set to be convex even when the lateral face S3 is not processed to be concave in the process of FIG. 15B.

Meanwhile, the switching layer 11 may be formed by a method other than oxidation. For example, when the lateral face S3 is processed to be concave in the process of FIG. 15B, the switching layer 11 may be formed using TDMA and $O_3$.

After that, the processes of FIG. 14B and FIG. 14C are performed. As above, the memory cell shown in FIG. 11 is formed.

Figure 16:
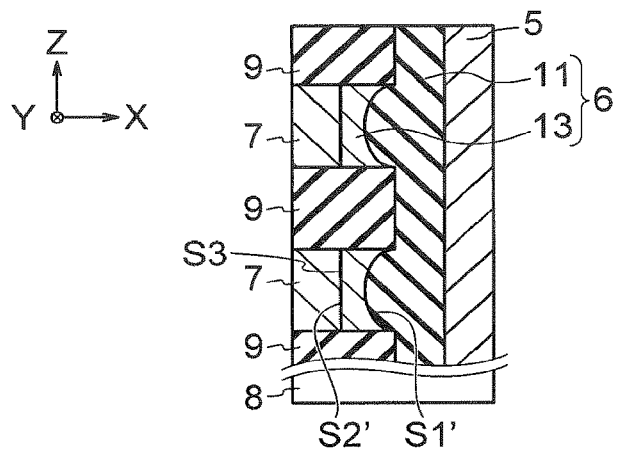
FIG. 16 is a cross-sectional view showing a structure of a semiconductor storage device according to another modification of the second embodiment.

FIG. 16 is a cross-sectional view showing a structure of a semiconductor storage device according to another modification of the second embodiment.

In the present modification, the lateral face S3 of the word line 7 has a planar shape. Moreover, the resistance change film 6 includes the second barrier layer 13 and the switching layer 11 which are sequentially provided on the lateral face S3 of the word line 7. The second barrier layer 13 is, for example, an amorphous silicon layer. The switching layer 11 is, for example, a titanium oxide film. A first lateral face S1' of the second barrier layer 13 on the local bit line 5 side has a concave shape recessed from the local bit line 5 side. A second lateral face S2' of the second barrier layer 13 on the word line 7 side has a planar shape. While the second barrier layer 13 is separated for each word line 7, the switching layer 11 is not separated for each word line 7 but is commonly provided on the lateral faces S3 of the plurality of word lines 7.

Since the first lateral face S1' of the second barrier layer 13 of the present modification has the concave shape recessed from the local bit line 5 side, the film thickness of the second barrier layer 13 is small in a middle portion between the upper face and the lower face of the inter layer dielectrics 9. Therefore, an electric field is hardly applied to this middle portion, which can suppress breakage of the second barrier layer 13. As a result, reliability of a memory cell can be improved.

Figure 17:
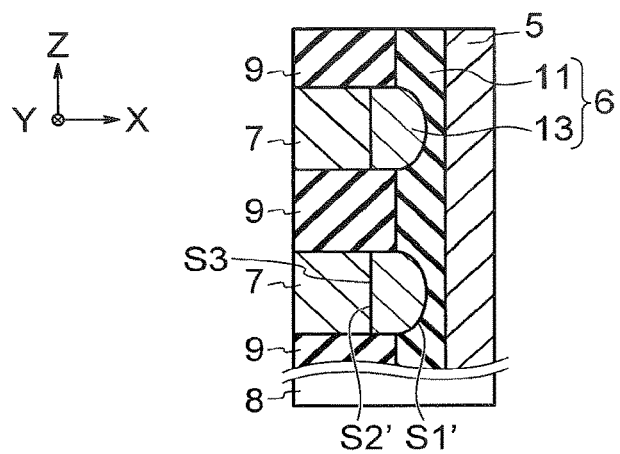
FIG. 17 is a cross-sectional view showing a structure of a semiconductor storage device according to another modification of the second embodiment.

FIG. 17 is a cross-sectional view showing a structure of a semiconductor storage device according to another modification of the second embodiment.

In the present modification, the lateral face S3 of the word line 7 has a planar shape. Moreover, the first lateral face S1' of the second barrier layer 13 has a convex shape protruding to the local bit line 5 side. The second lateral face S2' of the second barrier layer 13 has a planar shape.

Since the first lateral face S1' of the second barrier layer 13 of the present modification has the convex shape protruding to the local bit line 5 side, the film thickness of the second barrier layer 13 is large in a middle portion between the upper face and the lower face of the inter layer dielectrics 9. Therefore, an electric field tends to be applied to this middle portion, which enables a memory cell to be operated at low voltage. As a result, effects of increase in readout current of the memory cell and suppression of operation delay can be obtained, which enables high speed operation of a semiconductor storage device.

Figure 18:
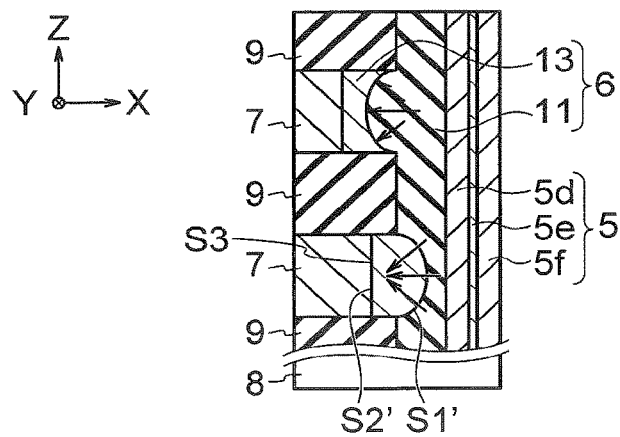
FIG. 18 is a cross-sectional view for explaining functions of the semiconductor storage devices shown in FIGS. 16 and 17.

FIG. 18 is a cross-sectional view for explaining functions of the semiconductor storage devices shown in FIGS. 16 and 17.

FIG. 18 shows the second barrier layer 13 (upper one) that is of a type shown in FIG. 16 and the second barrier layer 13 (lower one) that is of a type shown in FIG. 17. For the former second barrier layer 13, an electric field is hardly applied to the middle portion of the second barrier layer 13. Meanwhile, for the latter second barrier layer 13, an electric field tends to be applied to the middle portion of the second barrier layer 13.

FIG. 18 shows the local bit line 5 that has a first interconnect layer 5d, an intermediate metal layer 5e and a second interconnect layer 5f. The first and second interconnect layers 5d and 5f are, for example, titanium nitride films.

The intermediate metal layer 5e is, for example, a titanium oxynitride film. The intermediate metal layer 5e is exemplarily a second metal layer. Such a local bit line 5 can be applied to both the modification in FIG. 16 and the modification in FIG. 17. Details of this local bit line 5 are mentioned later.

FIGS. 19A to 20C are cross-sectional views showing a method of manufacturing the semiconductor storage device shown in FIG. 16.

Figure 19A:
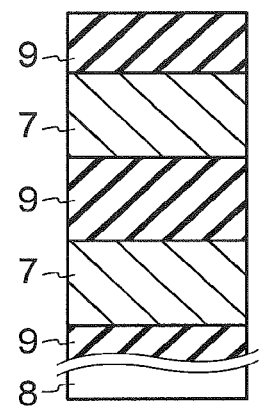
FIGS. 19A to 20C are cross-sectional views showing a method of manufacturing the semiconductor storage device shown in FIG. 16.
Figure 19B:
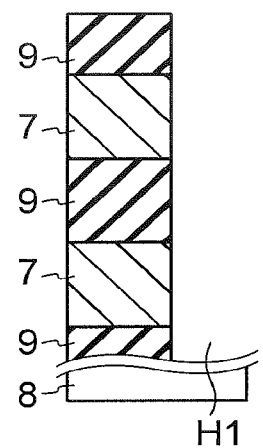

First, the plurality of inter layer dielectrics 9 and a plurality of line material layers which are materials of the plurality of word lines 7 are alternately stacked on the substrate 8 (FIG. 19A). Hereafter, the line material layer is expressed as "line material layer 7". Next, the opening H1 which penetrates the stacked structure of the inter layer dielectrics 9 and the line material layers 7 is formed (FIG. 19B).

Figure 19C:
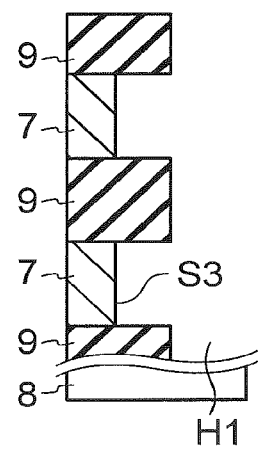

Next, lateral faces of the line material layers 7 exposed toward the opening H1 are recessed by liquid chemical processing (FIG. 19C). As a result, the plurality of openings H3 are formed between the inter layer dielectrics 9, and the word lines 7 having the lateral faces S3 are formed from the line material layers 7. When the composition of the titanium nitride film is represented by $Ti_XN_Y$, the word lines 7 of the present modification are formed only of titanium nitride films where X=Y. Therefore, the lateral faces S3 of the word lines 7 are planar.

Figure 20A:
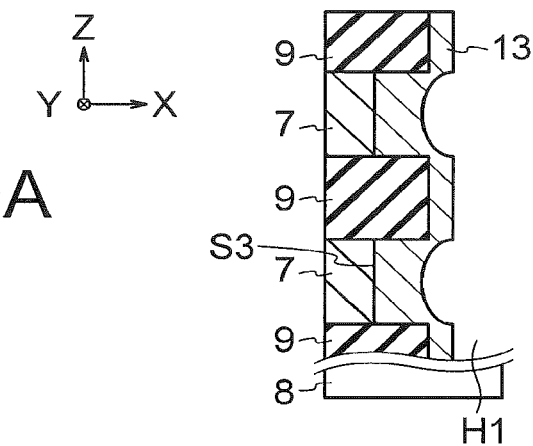

Next, the second barrier layer 13 is formed on the surfaces of the opening H1 and the openings H3 (FIG. 20A). The second barrier layer 13 is, for example, an amorphous silicon layer having 5 nm of film thickness. It is formed by CVD using $Si_2H_6$ gas at 350 to 600° C. As a result, the second barrier layer 13 having recess portions corresponding to the openings H3 is formed.

Figure 20B:
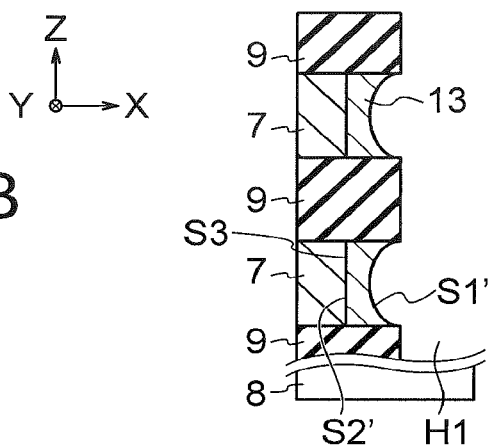

Next, the lateral face of the second barrier layer 13 is recessed by liquid chemical processing (FIG. 20B). As a result, the second barrier layer 13 is etched back with the aforementioned recess portions maintained, and the second barrier layer 13 outside the openings H3 is removed. Thereby, the second barrier layer 13 is separated for each word line 7, and the second barrier layer 13 corresponding to each word line 7 is processed to have the concave shaped first lateral face S1'.

Figure 20C:
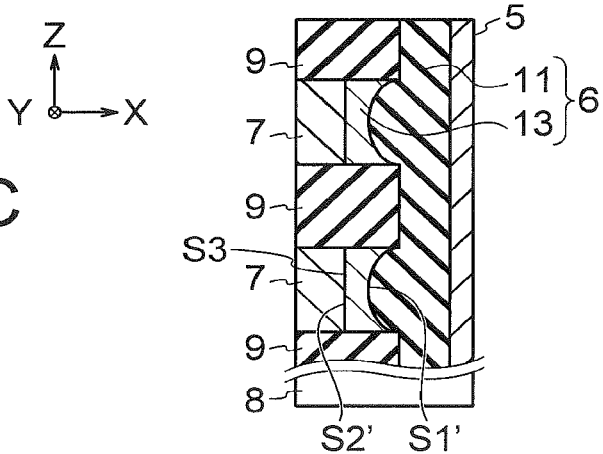

Next, the switching layer 11 is formed on the surface of the opening H1 (FIG. 20C). As a result, the resistance change film 6 including the switching layer 11 and the second barrier layer 13 is formed. The switching layer 11 is, for example, a titanium oxide film having 10 nm of film thickness, and is formed by CVD at 150 to 350° C.

Next, the local bit line 5 is formed in the opening H1 via the resistance change film 6 (FIG. 20C). The local bit line 5 is formed, for example, similarly to the process of FIG. 14C. As above, the memory cell shown in FIG. 16 is formed.

Figure 21A:
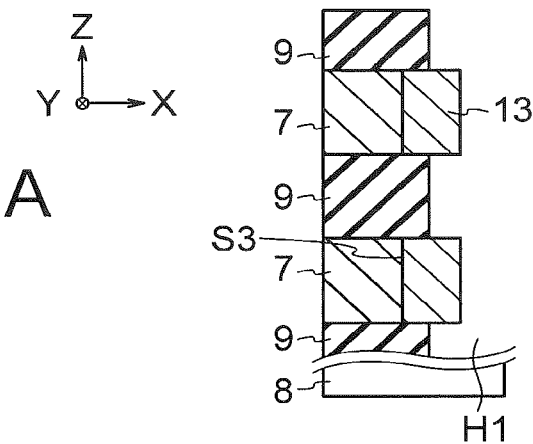
FIGS. 21A to 21C are cross-sectional views showing a method of manufacturing the semiconductor storage device shown in FIG. 17.
Figure 21B:
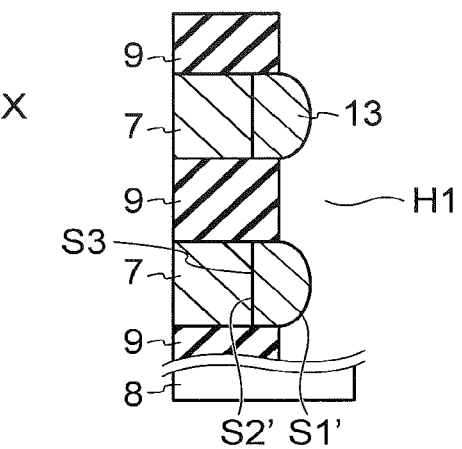
Figure 21C:
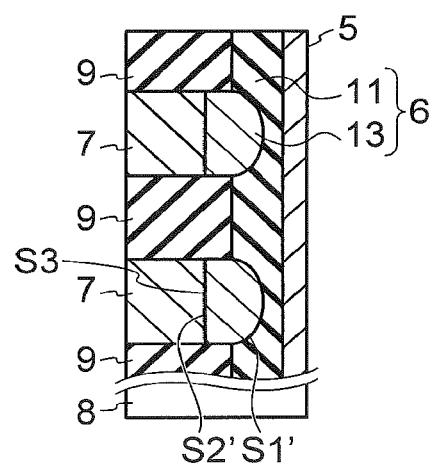

FIGS. 21A to 21C are cross-sectional views showing a method of manufacturing the semiconductor storage device shown in FIG. 17.

First, after the second barrier layer 13 separated for each word line 7 is formed through the processes of FIGS. 19A to 20B, the lateral faces of the inter layer dielectrics 9 are recessed by liquid chemical processing (FIG. 21A). Here, the second barrier layer 13 in this case is not needed to have the recess portions shown in FIG. 20A and FIG. 20B. Such a second barrier layer 13 can be realized by forming the second barrier layer 13 that has a sufficient film thickness in the process of FIG. 20A. The recessing amount of the inter layer dielectrics 9 is controlled so as not to exceeds the film thickness of the second barrier layer 13.

Next, the second barrier layer 13 is etched by liquid chemical processing (FIG. 21B). As a result, corner portions of the second barrier layer 13 are shaved by the etching to form the shapes of the first lateral faces S1' of the second barrier layers 13 to be convex.

Next, the switching layer 11 is formed on the surface of the opening H1, and the local bit line 5 is formed in the opening H1 via the switching layer 11 (FIG. 21C). As above, the memory cell shown in FIG. 17 is formed.

Figure 22A:
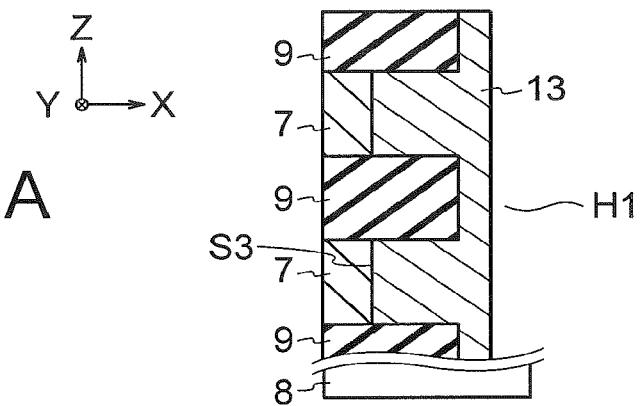
FIGS. 22A to 22C are cross-sectional views showing another example of the method of manufacturing the semiconductor storage device shown in FIG. 17.
Figure 22B:
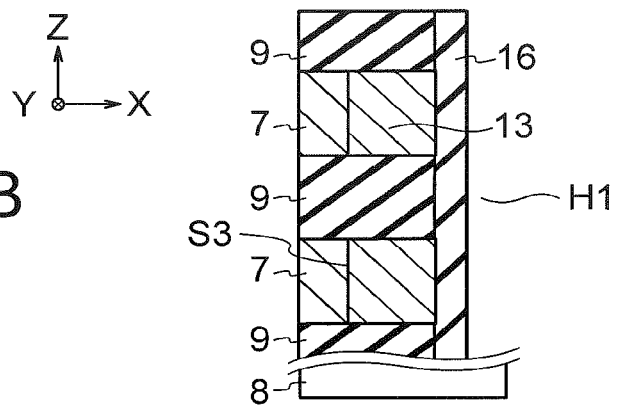
Figure 22C:
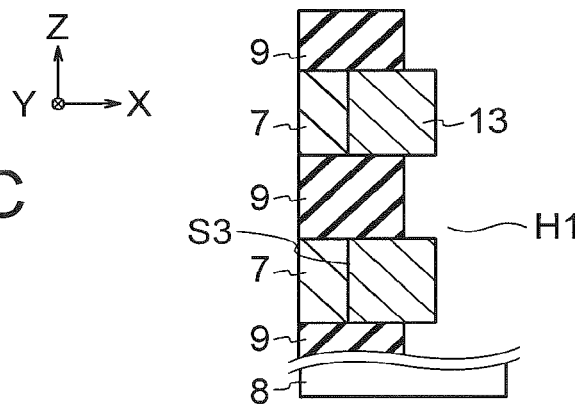

FIGS. 22A to 22C are cross-sectional views showing another example of a method of manufacturing the semiconductor storage device shown in FIG. 17.

First, the second barrier layer 13 is formed on the surfaces of the opening H1 and the openings H3 through the processes of FIGS. 19A to 20A (FIG. 22A). Here, the second barrier layer 13 in this case is not needed to have the recess portions shown in FIG. 20A and FIG. 20B. After that, the lateral face of the second barrier layer 13 may be recessed by liquid chemical processing similarly to the process of FIG. 20B. This recessing is performed such that the inter layer dielectrics 9 are not exposed toward the opening H1.

Next, by oxidating the surface of the second barrier layer 13, the second barrier layer 13 on the lateral faces of the inter layer dielectrics 9 is changed into an oxide film 16 (FIG. 22B). The second barrier layer 13 is, for example, an amorphous silicon layer. It is thermally oxidized with oxygen in a reduced pressure environment at or below 95000 Pa at 300 to 900° C. In this case, the oxide film 16 is a silicon oxide film.

Next, the lateral face of the oxide film 16 and the lateral faces of the inter layer dielectrics 9 are recessed by liquid chemical processing (FIG. 22C). The recessing amount of the inter layer dielectrics 9 is controlled so as not to exceed the film thickness of the second barrier layer 13.

Next, the processes of FIG. 21B and FIG. 21C are performed. As above, the memory cell shown in FIG. 17 is formed.

Figure 23A:
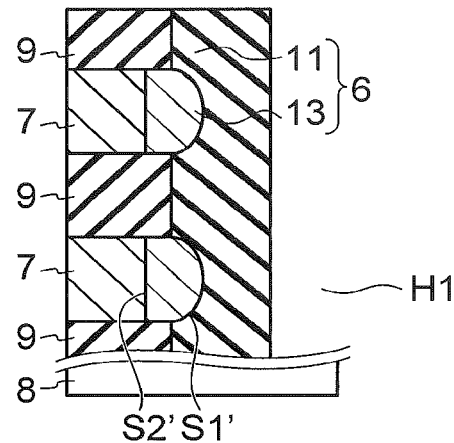
FIGS. 23A to 23C are cross-sectional views showing another example of the method of manufacturing the semiconductor storage device shown in FIG. 17.
Figure 23B:
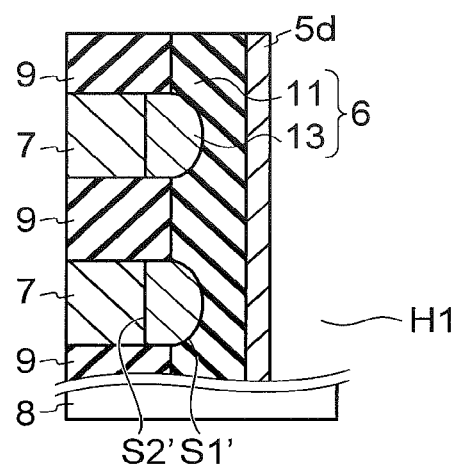
Figure 23C:
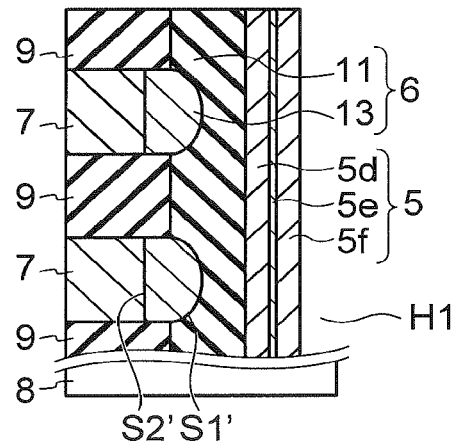

FIGS. 23A to 23C are cross-sectional views showing another example of a method of manufacturing the semiconductor storage device shown in FIG. 17.

First, after the processes of FIG. 21A and FIG. 21B are performed, the switching layer 11 is formed on the surface of the opening H1 (FIG. 23A). The switching layer 11 is, for example, a titanium oxide film having 10 nm of film thickness. It is formed by LPCVD using TDMAT and $O_3$ at 200 to 500° C.

Next, a portion of the switching layer 11 is nitridized to form the first interconnect layer 5d on the lateral face of the switching layer 11 (FIG. 23B). The first interconnect layer 5d is, for example, a titanium nitride film (or a titanium oxynitride film). It is formed by radical nitridization using plasma in an atmosphere of Ar (argon) gas and $N_2$ gas at 200 to 500° C.

After that, an opening for contact (not shown) with a TFT (see FIG. 1) is formed in the first interconnect layer 5d and the like by RIE. In this stage, the first interconnect layer 5d functions as a protective film which protects the switching layer 11 from the influence of RIE. This RIE forms the intermediate metal layer 5e on the lateral face of the first interconnect layer 5d (FIG. 23C). The intermediate metal layer 5e is, for example, a titanium oxynitride film (or a titanium oxide film).

Next, the second interconnect layer 5f is formed on the lateral face of the intermediate metal layer 5e to form the local bit line 5 in the opening H1 (FIG. 23C). The second interconnect layer 5f is, for example, a titanium nitride film.

It is formed by CVD using $TiCl_4$ gas and $NH_3$ gas at or below 1000 Pa and 700° C. As above, the memory cell shown in FIG. 17 is formed.

Herein, the first interconnect layer 5d is described.

When the first interconnect layer 5d (titanium nitride film) is formed by nitridizing a portion of the switching layer 11 (titanium oxide film), volume shrinkage that reduces its volume by half takes place. Thereby, highly integrated memory cells can be realized.

Moreover, since the first interconnect layer 5d formed by nitrization of the switching layer 11 is higher in selection ratio in RIE than the titanium oxide film, it can be easily processed. Moreover, a particle diameter of TiN crystal grains in the first interconnect layer 5d is small due to the influence of RIE. Moreover, since RIE forms the amorphous intermediate metal layer 5e on the lateral face of the first interconnect layer 5d, the second interconnect layer 5f can be formed without the influence of TiN crystal grains with small particle diameters in first interconnect layer 5d, and becomes a titanium nitride film having TiN crystal grains with large grain diameters. Therefore, the particle diameter of the TiN crystal grains in the second interconnect layer 5f is larger than the particle diameter of the TiN crystal grains in the first interconnect layer 5d.

Nitridization of the switching layer 11 may be performed by one other than radical nitridization, and, for example, may be performed by thermal nitridization using $NH_3$ gas or plasma nitridization. When the titanium oxide film constituting the switching layer 11 is nitridized, a nitrogen profile arises in this titanium oxide film. The presence of nitrogen in the titanium oxide film can afford an effect of increasing a reading current due to oxygen deficiency and an effect of being capable of controlling oxygen defects in the resistance change film 6.

In general, while RIE processing of a titanium oxide film is difficult, RIE processing of a titanium nitride film is easy. When the first interconnect layer 5d is formed by nitridizing a portion of the switching layer 11, there arises an advantage that RIE processing for contact with a TFT is easy. Moreover, the first interconnect layer 5d can suppress an impurity originated from Cl-containing gas used for RIE processing from penetrating into the switching layer 11.

As above, the resistance change film 6 of the present embodiment includes the switching layer 11 having the curved plane shaped first lateral face S1 or second lateral face S2, or the second barrier layer 13 having the curved plane shaped first lateral face S1' or second lateral face S2'.

Therefore, according to the present embodiment, an electric field can tend to be applied to the switching layer 11 or the second barrier layer 13, which enables a ReRAM cell to operate at a constant voltage, or an electric field can be hardly applied to the switching layer 11 or the second barrier layer 13, which improves reliability of a ReRAM cell. As above, according to the present embodiment, ReRAM cells can operate at a suitable voltage.

(Third Embodiment)

Figure 24:
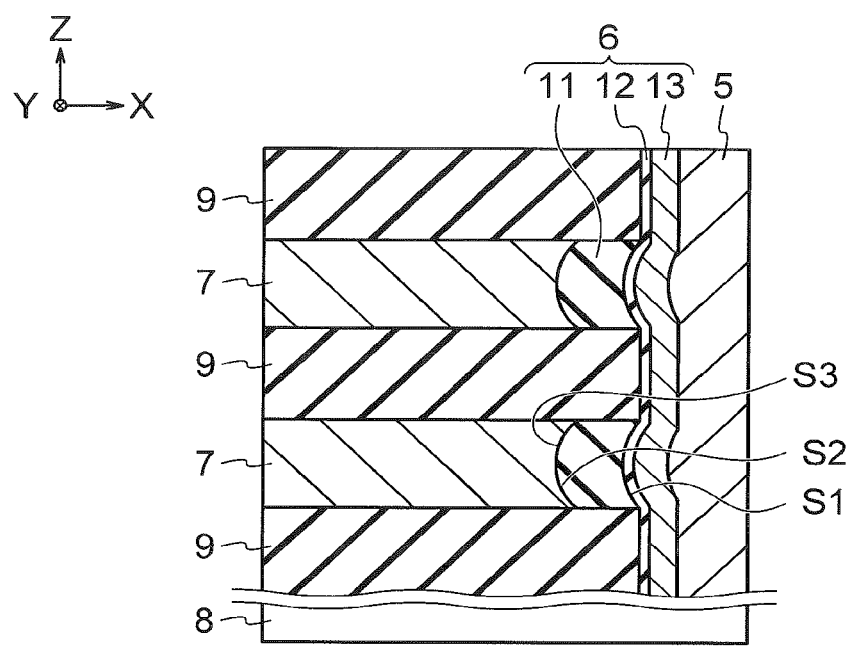
FIG. 24 is a cross-sectional view showing a structure of a semiconductor storage device of a third embodiment.

FIG. 24 is a cross-sectional view showing a structure of a semiconductor storage device of a third embodiment.

In the present embodiment, the lateral faces S3 of the word lines 7 have concave shapes recessed from the local bit line 5 side. Moreover, the resistance change film 6 includes the switching layer 11, the first barrier layer 12 and the second barrier layer 13 which are sequentially provided on the lateral face S3 of the word line 7. The switching layer 11 is, for example, a titanium oxide film. The first barrier layer 12 is, for example, an aluminum oxide film. The second barrier layer 13 is, for example, an amorphous silicon layer.

The first lateral face S1 of the switching layer 11 has a concave shape recessed from the local bit line 5 side. The second lateral face S2 of the switching layer 11 has a convex shape protruding to the word line 7 side. While the switching layer 11 is separated for each word line 7, the first barrier layer 12 and the second barrier layer 13 are not separated for each word line 7 but commonly provided to the lateral faces S3 of the plurality of word lines 7.

Since the switching layer 11 of the present embodiment is separated for each word line 7, a current can be suppressed from flowing from a certain word line 7 to another word line 7 via the switching layer 11. Therefore, according to the present embodiment, a leak current between the word line 7 can be reduced. Since a titanium oxide film, which constitutes the switching layer 11, is high in dielectric constant, the dielectric constant being high also contributes the reduction of the leak current.

Moreover, the second lateral face S2 of the switching layer 11 of the present embodiment has the convex shape protruding to the word line 7 side. Therefore, the film thickness of the switching layer 11 is large in a middle portion between the upper face and the lower face of the inter layer dielectrics 9. Hence, an electric field is hardly applied to this middle portion, which can suppress breakage of the switching layer 11. As a result, reliability of memory cells can be improved.

FIGS. 25A to 26C are cross-sectional views showing a method of manufacturing the semiconductor storage device of the third embodiment.

Figure 25A:
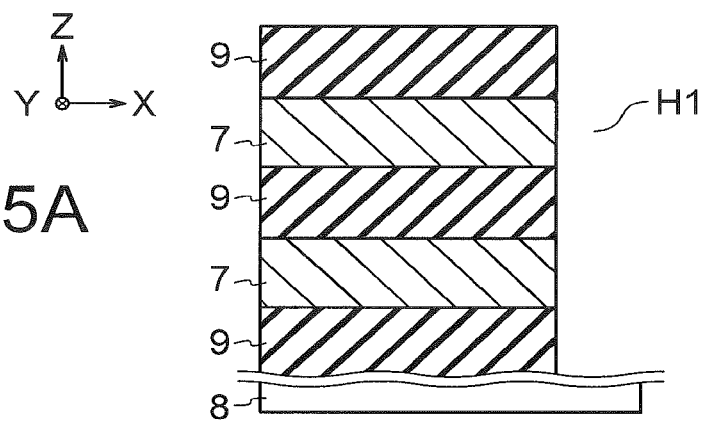
FIGS. 25A to 26C are cross-sectional views showing a method of manufacturing the semiconductor storage device of the third embodiment.

First, the plurality of inter layer dielectrics 9 and a plurality of line material layers which are materials of the plurality of word lines 7 are alternately stacked on the substrate 8 (FIG. 25A). The inter layer dielectric 9 is, for example, a silicon oxide film having 15 nm of film thickness. It is formed by plasma CVD using $SiH_4$ gas and $N_2O$ gas at 200 to 500° C. The line material layer is, for example, a titanium nitride film having 15 nm of film thickness, and is formed by sputtering. Hereafter, the line material layer is expressed as "line material layer 7".

Next, by lithography and RIE, the opening H1 which penetrates a stacked structure of the inter layer dielectrics 9 and the line material layers 7 is formed (FIG. 25A). The lithography and the RIE are performed with a hard mask layer (for example, a polysilicon layer) formed between the aforementioned stacked structure and a resist film.

Figure 25B:
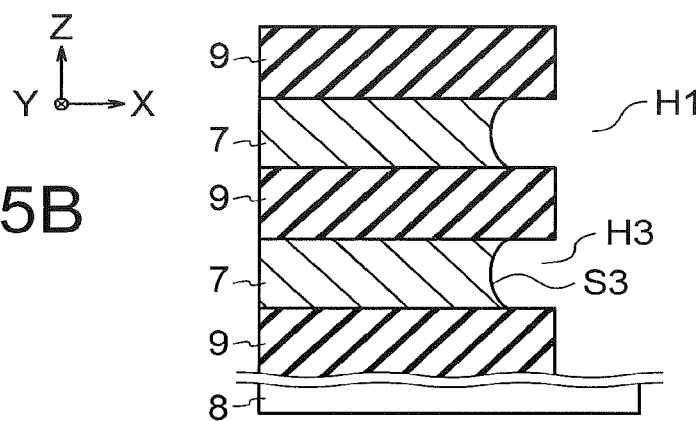

Next, lateral faces of the line material layers 7 exposed toward the opening H1 are recessed by liquid chemical processing (FIG. 25B). As a result, the plurality of openings H3 are formed between the inter layer dielectrics 9, and the word lines 7 having the lateral faces S3 are formed from the line material layers 7. The liquid chemical is exemplarily a mixed solution containing phosphoric acid, nitric acid and acetic acid. An example of a method of forming the lateral faces S3 having concave shapes is similar to the one described for the second embodiment.

Figure 25C:
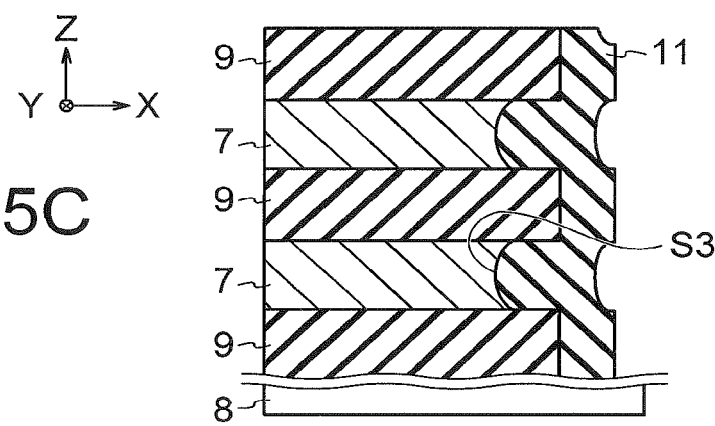

Next, the switching layer 11 is formed on the surfaces of the opening H1 and the openings H3 (FIG. 25C). The switching layer 11 is, for example, a titanium oxide film and is formed by ALD. In this stage, since ALD can achieve high surface coverage, the switching layer 11 having recess portions corresponding to the openings H3 is formed.

Figure 26A:
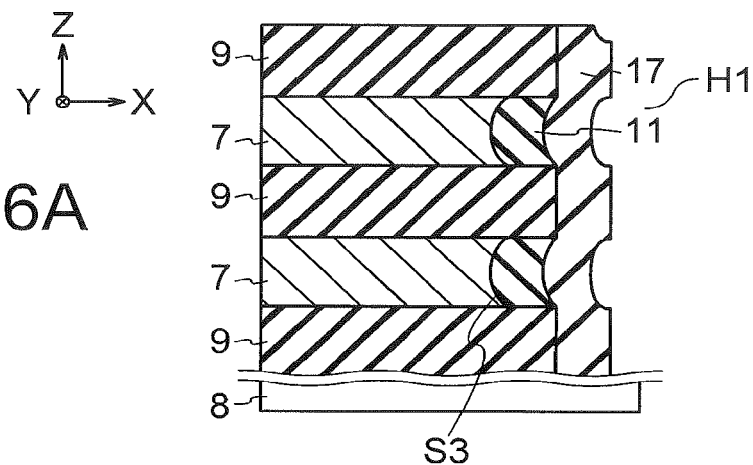

Next, by nitridizing the surface of the switching layer 11, the switching layer 11 on the lateral faces of the inter layer dielectrics 9 are changed into a nitride film 17 (FIG. 26A). The switching layer 11 is nitridized, for example, by $N_2$ radical processing at approximately 400° C. In this stage, since the nitridization of the switching layer 11 proceeds uniformly from the surface of the switching layer 11, the interface between the switching layer 11 and the nitride film 17 also becomes a curved plane. The nitride film 17 of the present embodiment is a titanium nitride film.

Figure 26B:
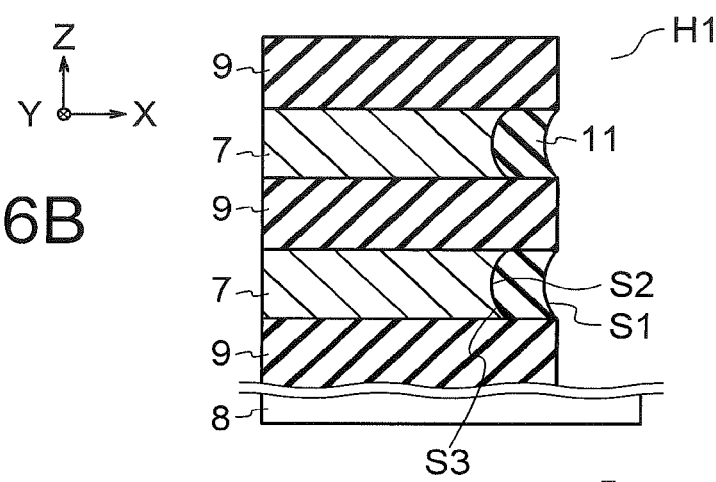

Next, the nitride film 17 is removed through etching using a liquid chemical or gas (FIG. 26B). Thereby, the switching layer 11 is separated for each word line 7, and each switching layer 11 is processed so as to have the first lateral face S1 recessed from the opening H1 side and the second lateral face S2 protruding to the word line 7 side. When a mixed solution containing phosphoric acid, nitric acid and acetic acid is used as the liquid chemical, a selection ratio between the nitride film 17 and the inter layer dielectrics 9, and a selection ratio between the nitride film 17 and the switching layers 11 can be sufficiently set. The same holds true for the case of using gas whose main component is $Cl_2$.

Figure 26C:
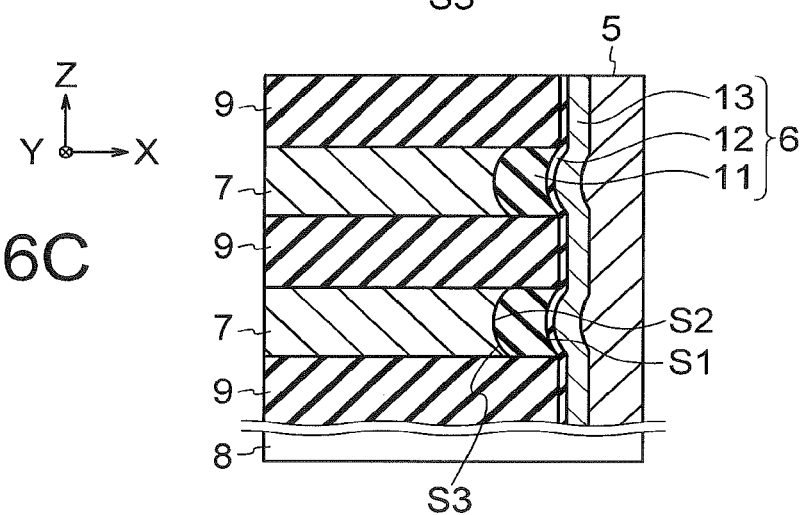

Next, the first barrier layer 12 and the second barrier layer 13 are sequentially formed on the surfaces of the opening H1 and the openings H3 (FIG. 26C). As a result, the resistance change film 6 including the switching layer 11, the first barrier layer 12 and the second barrier layer 13 is formed.

Next, the local bit line 5 is formed in the opening H1 via the resistance change film 6 (FIG. 26C). As above, the memory cell shown in FIG. 24 is formed.

As above, the resistance change film 6 of the present embodiment includes the switching layer 11 having the curved plane shaped first lateral face S1 and second lateral face S2. Therefore, according to the present embodiment, an electric field can be hardly applied to the switching layer 11, and reliability of ReRAM cells can be improved.

Moreover, the switching layer 11 of the present embodiment is nitridized after being commonly formed to the lateral faces S3 of the plurality of word lines 7, and is separated for each word line 7 by removing the nitridized portion. Thereby, the switching layer 11 having the curved plane shaped first lateral face S1 and second lateral face S2 can be formed. Furthermore, by the switching layer 11 being doped with nitrogen, performance of the switching layer 11 can be improved.

FIGS. 27A to 27C are cross-sectional views showing a method of manufacturing a semiconductor storage device according to a modification of the third embodiment.

First, the processes of FIG. 25A to FIG. 26B are performed. FIG. 27A shows the same state as that of FIG. 26B. The first lateral face S1 and the second lateral face S2 shown in FIG. 27A have planar shapes. Nevertheless, they may have curved plane shapes as in FIG. 26B. The same holds true for the lateral faces S3 of the word lines 7.

The switching layer 11 of the present modification is composed of a first portion 11a until the process of FIG. 27A, and a second portion 11b formed in processes mentioned later. The first lateral face S1 in FIG. 27A is a lateral face of the first portion 11a. Signs × in FIG. 27A represent halogen or phosphorus (P) introduced near the first lateral face S1 in the first portion 11a. The halogen is exemplarily fluorine (F) or chlorine (Cl).

In the process of FIG. 26B, the nitride film 17 is removed using a liquid chemical or gas. In this stage, when a mixed solution (mixed acid) containing phosphoric acid, nitric acid and acetic acid as the liquid chemical, phosphorus originated from the phosphoric acid is introduced in the vicinity of the first lateral face S1. In this case, a phosphorus concentration near the first lateral face S1 in the first portion 11a is, for example, $1\times10^{18}$ atoms/cc or more. Meanwhile, when gas containing fluorine elements or chlorine elements (for example, $C_4F_6$ or $C_4F_8$) is used, fluorine or chlorine originated from this gas is introduced in the vicinity of the first lateral face S1. In this case, a fluorine concentration or a chlorine concentration near the first lateral face S1 in the first portion 11a is, for example, $1\times10^{18}$ atoms/cc or more.

Next, the second portion 11b of the switching layer 11 is formed on the surface of the opening H1 by CVD (FIG. 27B). The first portion 11a, the second portion 11b and the inter layer dielectric 9 of the present modification are a $TiO_X$ film, a $TiO_X$ film and an $SiO_2$ film, respectively. In the present modification, the second portion 11b can be selectively formed only on the surface of the first portion 11a, taking advantage of a difference in incubation time originated from a difference between the $TiO_X$ film and the $SiO_2$ film. An average film thickness of the second portion 11b of the present modification is, for example, 1 to 2 nm.

In FIG. 27B, the second lateral face S2 is a lateral face of the first portion 11a, and the first lateral face S1 is a lateral face of the second portion 11b. According to the CVD of FIG. 27B, the second portion 11b is formed such that the second lateral face S2 is convex.

Next, the first barrier layer 12, the second barrier layer 13 and the local bit line 5 are sequentially formed in the opening H1 (FIG. 27C). As above, the memory cells of the present modification are formed.

According to the present modification, halogen or phosphorus can improve characteristics of the switching layer 11. For example, halogen or phosphorus can fix crystal defects in the switching layer 11, which can improve characteristics of the surface (first lateral face S1) of the second portion 12b which is formed after that.

Figure 28A:
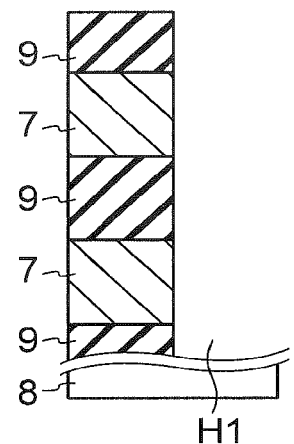
FIGS. 28A to 28C are cross-sectional views showing a method of manufacturing a semiconductor storage device according to another modification of the third embodiment.
Figure 28B:
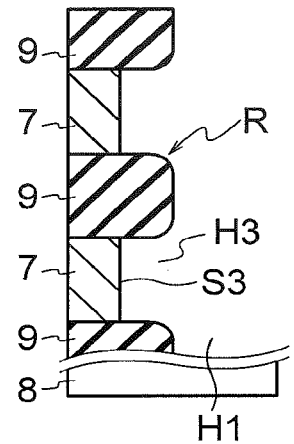
Figure 28C:
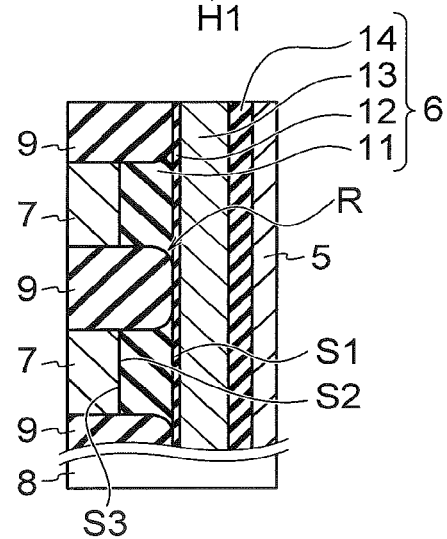

FIGS. 28A to 28C are cross-sectional views showing a method of manufacturing a semiconductor storage device according to another modification of the third embodiment.

First, similarly to the process of FIG. 25A, the plurality of inter layer dielectrics 9 and the plurality of line material layers 7 are alternately stacked on the substrate 8. The opening H1 which penetrates a stacked structure of the inter layer dielectrics 9 and the line material layers 7 is formed (FIG. 28A).

Next, similarly to the process of FIG. 25B, lateral faces of the line material layers 7 exposed toward the opening H1 are recessed by liquid chemical processing (FIG. 28B). As a result, the plurality of openings H3 are formed between the inter layer dielectrics 9, and the word lines 7 having the lateral faces S3 are formed from the line material layers 7. The liquid chemical is exemplarily a mixed solution containing phosphoric acid, nitric acid and acetic acid. While the lateral faces S3 shown in FIG. 28B have planar shapes, they may have curved plane shapes as in FIG. 25B.

Sign R indicates that the upper face and the lower face of each inter layer dielectric 9 have round shapes near the lateral face of each inter layer dielectric 9. Due to the etching with the mixed acid, the upper face and the lower face of each inter layer dielectric 9 are changed into round shapes. For example, when a concentration of the mixed acid is high or when a use time of the mixed acid is long, such round shapes appear.

After that, the processes of FIGS. 25C to 26C are performed, and memory cells of the present modification are formed as shown in FIG. 28C. In the present modification, the third barrier layer 14 is formed between the second barrier layer 13 and the local bit line 5. Moreover, while the first lateral faces S1 shown in FIG. 28C have planar shapes, they may have curved plane shapes as in FIG. 26C.

With the switching layer 11 of the present modification, the upper face and the lower face of each inter layer dielectric 9 have round shapes, and thereby, concentration of an electric field can arise similarly to the switching layer 11 of FIG. 4A. Therefore, operation voltage needed for resistance change in a memory cell in setting operation can be reduced.

FIGS. 29A to 29C are cross-sectional views showing a method of manufacturing a semiconductor storage device according to another modification of the third embodiment.

In the present modification, similarly to FIG. 28B, round shapes are formed (FIG. 29A). Next, a fourth barrier layer 19 and the switching layer 11 are sequentially formed on the surfaces of the opening H1 and the like (FIG. 29A). The fourth barrier layer 19 is, for example, a metal oxide film such as an aluminum oxide film ($AlO_X$).

Next, the processes of FIGS. 26A and 26B are performed. Thereby, the fourth barrier layer 19 and the switching layer 11 are separated for each word line 7, and each switching layer 11 is processed so as to have the first lateral face S1 and the second lateral face S2 (FIG. 29B). While the first lateral faces S1 shown in FIG. 29B have planar shapes, they may have curved plane shapes as in FIG. 26B.

After that, the process of FIG. 26C is performed, and memory cells of the present modification are formed as shown in FIG. 29C. In the present modification, the third barrier layer 14 is formed between the second barrier layer 13 and the local bit line 5. As a result, the resistance change film 6 of the present modification includes the switching layer 11, the first barrier layer 12, the second barrier layer 13, the third barrier layer 14 and the fourth barrier layer 19.

According to the present modification, the fourth barrier layer 19 separates the word line (line material layer) 7 from the switching layer 11. Thereby, for example, oxygen in the switching layer 11 can be suppressed from being diffused in the word line 7. Furthermore, crystallization in the switching layer can be suppressed, which enables easy mixed acid processing in the process of FIG. 29B.

(Fourth Embodiment)

Figure 30:
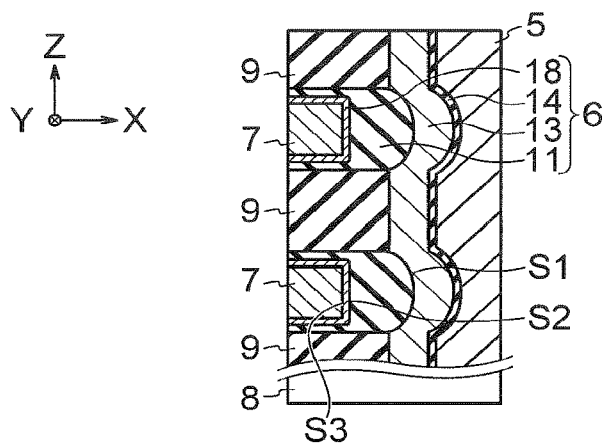
FIG. 30 is a cross-sectional view showing a structure of a semiconductor storage device of a fourth embodiment.

FIG. 30 is a cross-sectional view showing a structure of a semiconductor storage device of a fourth embodiment.

In the present embodiment, the lateral faces S3 of the word lines 7 have planar shapes. Moreover, the resistance change film 6 includes a metal layer 18, the switching layer 11, the second barrier layer 13 and the third barrier layer 14 which are sequentially provided on the lateral face S3 of the word line 7. The metal layer 18 is, for example, a titanium oxynitride film. The switching layer 11 is, for example, a titanium oxide film. The second barrier layer 13 is, for example, an amorphous silicon layer. The third barrier layer 14 is, for example, a silicon oxide film.

The metal layer 18 and the switching layer 11 are sequentially provided above the word line 7, below the word line 7 and between the local bit line 5 and the word line 7. The second lateral face S2 of the switching layer 11 has a planar shape. The first lateral face S1 of the switching layer 11 has a convex shape protruding to the word line 7 side. The metal layer 18 and the switching layer 11 are separated for each word line 7.

The second barrier layer 13 and the third barrier layer 14 are sequentially provided between the local bit line 5 and the word line 7. While the first and second barrier layers 12 and 13 of the third embodiment have shapes recessed from the local bit line 5 side (FIG. 24) due to the first lateral face S1 having the concave shape, the second and third barrier layers 13 and 14 of the present embodiment have shapes protruding to the local bit line 5 side due to the first lateral face S1 having the convex shape. As shown in FIG. 30, the second barrier layer 13 and the third barrier layer 14 are not separated for each word line 7 but commonly provided to the lateral faces S3 of the plurality of word lines 7.

Since the first lateral face S1 of the switching layer 11 of the present embodiment has the convex shape protruding to the local bit line 5 side, the film thickness of the switching layer 11 is large in a middle portion between the upper face and the lower face of the inter layer dielectrics 9. Therefore, an electric field tends to be applied to this middle portion, which enables a memory cell to operate at low voltage. As a result, an effect of increase in readout current of the memory cell and an effect of suppression of operation delay are obtained, which enables high speed operation of a semiconductor storage device.

Moreover, the resistance change film 6 of the present embodiment includes the metal layer 18 between the word line and the switching layer 11. Hence, in the present embodiment, since the metal layer 18 which is a TiON film intervenes between the word line 7 (TiN film) and the switching layer 11 (TiO$_X$ film), a contact resistance between the word line 7 and the switching layer 11 can be reduced.

Figure 31:
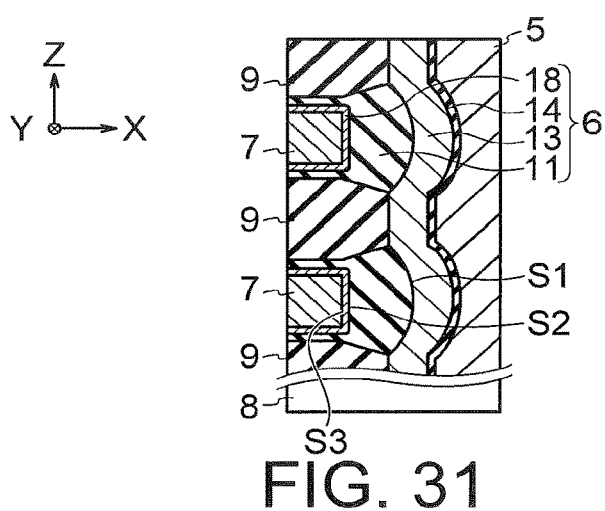
FIG. 31 is a cross-sectional view showing a structure of a semiconductor storage device according to a modification of the fourth embodiment.

FIG. 31 is a cross-sectional view showing a structure of a semiconductor storage device according to a modification of the fourth embodiment.

In the present modification, the upper faces and the lower face of the inter layer dielectrics 9 have tapered shapes near the second barrier layer 13. Specifically, the height of the upper face becomes higher as coming closer to the second barrier layer 13, and the height of the lower face becomes lower as coming closer to the second barrier layer 13. This is similar to the situation of the inter layer dielectrics 9 shown in FIG. 7C. Such a structure has an advantage that overexpansion of the switching layer 11 can be suppressed.

Figure 32:
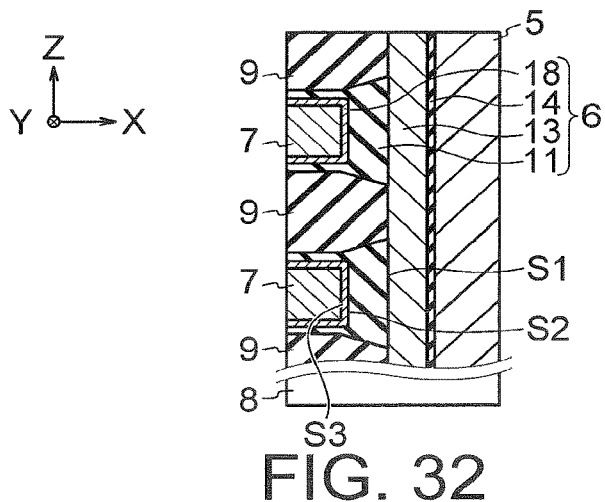
FIG. 32 is a cross-sectional view showing a structure of a semiconductor storage device according to another modification of the fourth embodiment.

FIG. 32 is a cross-sectional view showing a structure of a semiconductor storage device according to another modification of the fourth embodiment.

In the present modification, while the upper face and the lower face of the inter layer dielectrics 9 have a tapered shape near the second barrier layer 13 similarly to FIG. 31, the first lateral faces S1 of the switching layers 11 have a planar shape. Caused by this, the first and second barrier layers 12 and 13 also have planar shapes. The structure of the present modification can be realized, for example, by the upper face and the lower face of the inter layer dielectrics 9 having the tapered shape, which suppresses expansion of the switching layer 11 toward the local bit line 5 side.

FIGS. 33A to 34B are cross-sectional views showing a method of manufacturing the semiconductor storage device of the fourth embodiment.

Figure 33A:
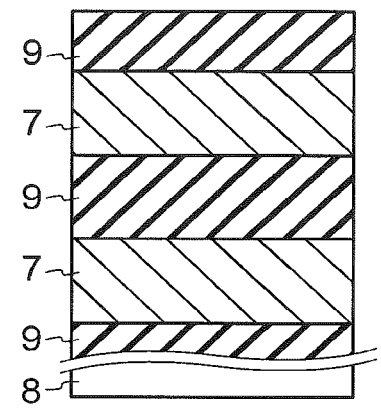
FIGS. 33A to 34B are cross-sectional views showing a method of manufacturing the semiconductor storage device of the fourth embodiment.

First, the plurality of inter layer dielectrics 9 and a plurality of line material layers which are materials of the plurality of word lines 7 are alternately stacked on the substrate 8 (FIG. 33A). The inter layer dielectric 9 is, for example, a silicon oxide film having 15 nm of film thickness. It is formed by plasma CVD using SiH$_4$ gas and N$_2$O gas at 200 to 500° C. The line material layer is, for example, a titanium nitride film having 15 nm of film thickness, and is formed by sputtering. Hereafter, the line material layer is expressed as "line material layer 7". The line material layer 7 is exemplarily the second film.

Figure 33B:
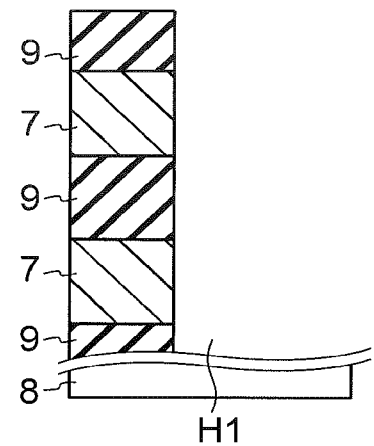

Next, by lithography and RIE, the opening H1 which penetrates the stacked structure of the inter layer dielectrics 9 and the line material layers 7 is formed (FIG. 33B). The lithography and the RIE are performed with a hard mask layer (for example, a polysilicon layer) formed between the aforementioned stacked structure and a resist film.

Figure 33C:
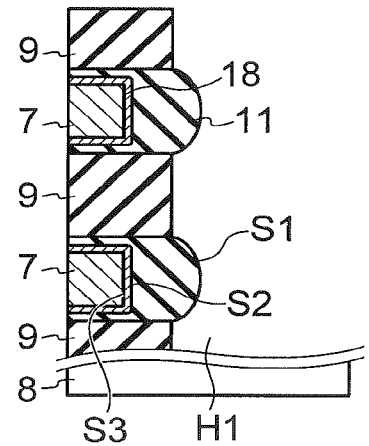

Next, lateral faces of the line material layers 7 exposed toward the opening H1 undergo thermal oxidation with oxygen in a reduced pressure environment at or below 95000 Pa at 300 to 900° C. (FIG. 33C). As a result, the switching layer 11 having the first lateral face S1 protruding to the local bit line 5 side and the planar second lateral face S2 is formed on the lateral faces of the line material layers 7. Furthermore, this thermal oxidation forms the metal layer 18 between the line material layer 7 and the switching layer 11. The switching layer 11 is, for example, a titanium oxide film. The metal layer is, for example, a titanium oxynitride film. Since the switching layer 11 of the present embodiment is formed by oxidation of the titanium nitride film (line material layer 7), it becomes a titanium oxide film having a rutile structure. It has a lower carrier mobility than a titanium oxide film having an anatase structure. This suppresses carrier movement due to its self-electric field in holding charge, which improves charge holding characteristics.

Approximately two-fold volume expansion arises when a portion of the line material layer 7 is oxidized into the switching layer 11. Hence, volume expansion toward the opening H1 mainly proceeds, which makes the first lateral face S1 be a convex shape. In order to suppress this volume expansion, the lateral face of the line material layer 7 may be recessed with an alkaline liquid chemical before oxidation of the lateral face of the line material layer 7. A method of the recessing is similar to the processes, for example, of FIG. 13C and FIG. 15B.

In the thermal oxidation of the line material layers 7, a portion of an oxidizing agent permeates through the inter layer dielectrics 9 and oxidizes the line material layers 7. Hence, the switching layers 11 and the metal layers 18 are also formed between the upper faces and the lower faces of the inter layer dielectrics 9 and the upper faces and the lower faces of the line material layers 7.

Figure 34A:
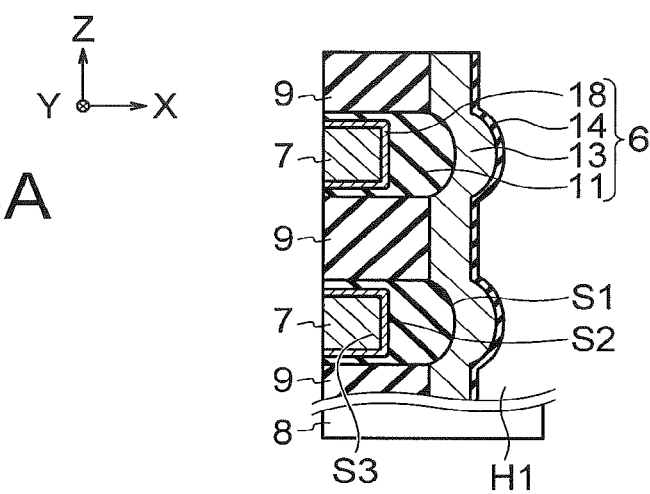

Next, the second barrier layer 13 and the third barrier layer 14 are formed on the surface of the opening H1 (FIG. 34A). As a result, the resistance change film 6 including the metal layer 18, the switching layer 11, the second barrier layer 13 and the third barrier layer 14 is formed. The second barrier layer 13 is, for example, an amorphous silicon layer having 5 nm of film thickness. It is formed by CVD using Si$_2$H$_6$ gas at 350 to 600° C. The third barrier layer 14 is, for example, a silicon oxide film and is formed as a natively oxidized film on the surface of the amorphous silicon layer.

Figure 34B:
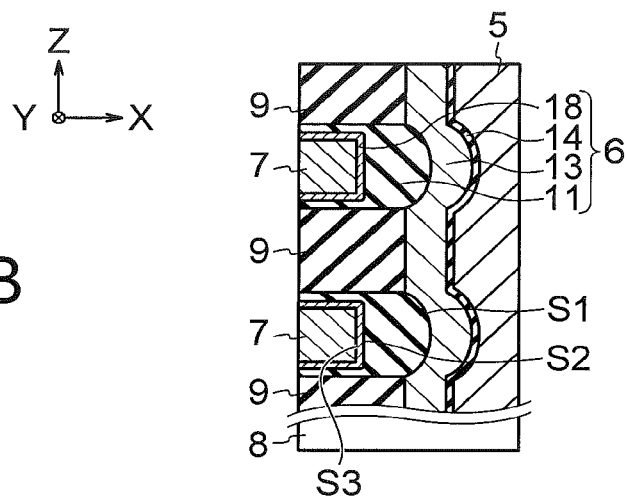

Next, the local bit line 5 is formed in the opening H1 via the resistance change film 6 (FIG. 34B). The local bit line 5 is formed, for example, by forming a titanium nitride film by CVD using TiCl$_4$ gas and NH$_3$ gas at or below 1000 Pa and 700° C., forming an opening for contact with a TFT (see FIG. 1) in this titanium nitride film by RIE, and forming a further titanium nitride film by CVD using TiCl$_4$ gas and NH$_3$ gas at or below 1000 Pa and 700° C. As above, the memory cells shown in FIG. 30 are formed.

As above, the resistance change film 6 of the present embodiment includes the switching layer 11 having a curved plane shaped first lateral face S1. Therefore, according to the present embodiment, an electric field can tend to be applied to the switching layer 11, and ReRAM cells can operate at a constant voltage.

Moreover, the resistance change film 6 of the present embodiment includes the metal layer 18 between the word line 7 and the switching layer 11. Therefore, according to the present embodiment, a contact resistance between the word line 7 and the switching layer 11 can be reduced by a TiN/TiON/TiO$_X$ stacked structure.

(Fifth Embodiment)

FIGS. 35A to 35C are cross-sectional views showing a method of manufacturing a semiconductor storage device of a fifth embodiment. The method of the present embodiment can be applied, for example, in order to form any of the switching layers 11 in the first to fourth embodiments.

First, the switching layer 11 is formed on a lateral face of the word line 7 (FIG. 35A). The switching layer 11 is, for example, a TiO$_X$ film formed using TDMAT. It is formed by ALD at 150 to 400° C. Ti is exemplarily a first metal element. The film thickness of the switching layer 11 of the present embodiment is, for example, 5 nm or less, and specifically, 4 nm. The switching layer 11 in the case of the first embodiment is formed on the lateral face of the local bit line 5 (see FIG. 5C) not on the lateral face of the word line 7.

Next, the first barrier layer 12 is formed on the lateral face of the switching layer 11 (FIG. 35A). The first barrier layer 12 is, for example, a HfO$_X$ film formed using TEMAH (tetrakis(ethylmethylamido)hafnium) and O$_3$. It is formed by ALD at 150 to 400° C. The film thickness of the first barrier layer 12 is, for example, 0.1 nm. The first barrier layer 12 may be a high-k film (high dielectric constant film) other than the HfO$_X$ film, and, for example, may be a ZrO$_X$ film.

Next, a sacrificial film 20 is formed on the lateral face of the first barrier layer 12 (FIG. 35A). The sacrificial film 20 is, for example, a TiO$_X$ film formed using TDMAT. It is formed by ALD at 150 to 400° C. The film thickness of the sacrificial film 20 is, for example, 6 nm. The sacrificial film 20 is exemplarily a third film.

Next, the switching layer 11, the first barrier layer 12 and the sacrificial film 20 are annealed at or above 500° C. in a N$_2$ atmosphere (FIG. 35B). Thereby, TiO$_X$ in the switching layer 11 or the sacrificial film 20 is crystallized.

Next, the sacrificial film 20 is removed from the lateral face of the first barrier layer 12 by RIE with the first barrier layer 12 being as an etching stopper (FIG. 35C). This RIE is performed, for example, using C$_A$F$_B$-based gas (A and B are integers not more than 1). As above, the resistance change film 6 including the switching layer 11, the first barrier layer 12 and the like is formed as in the first to fourth embodiments.

In general, when the switching layer 11 with a small film thickness of 4 nm or smaller is annealed, there are a possibility that TiO$_X$ in the switching layer 11 is not sufficiently crystallized and a possibility that a crystal particle diameter of TiO$_X$ in the switching layer 11 becomes small. On the other hand, when the film thickness of the switching layer 11 is made large, there is a possibility that the switching layer 11 or the like closes the opening H1 or the like.

The switching layer 11 of the present embodiment is annealed along with the sacrificial film 20 which contains TiO$_X$ similarly to the switching layer 11. Hence, crystallization of the switching layer 11 can be promoted even if the film thickness of the switching layer 11 is small. Namely, according to the present embodiment, TiO$_X$ in the switching layer 11 can be sufficiently crystallized, and the crystal particle diameter of TiO$_X$ in the switching layer 11 can be made large.

Moreover, in the present embodiment, by setting the first barrier layer 12 to be a HfO$_X$ film, a metal element (herein, Hf) in the first barrier layer 12 can be suppressed from being diffused in the switching layer 11 during the aforementioned annealing. Such an effect can also be realized by a high-k film other than the HfO$_X$ film.

The switching layer 11 and the first barrier layer 12 of the present embodiment may contain halogen or phosphorus, for example, as for the switching layer 11 in FIG. 27C.

Moreover, the method of the present embodiment can also be applied to a resistance change film with a different shape and composition from those of the resistance change films 6 of the first to fourth embodiments. For example, the method of the present embodiment can also be applied to a resistance change film in a two-dimensional ReRAM not a three-dimensional ReRAM as in FIG. 1.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
   a first interconnect extending in a first direction;
   a plurality of second interconnects extending in a second direction different from the first direction;
   a plurality of first insulators provided alternately with the second interconnects; and
   a resistance change film provided between the first interconnect and at least one of the second interconnects and including at least one of a first metal layer and a first semiconductor layer that includes a first face provided on a first interconnect side and having a convex shape protruding to the first interconnect side and a second face provided on a second interconnect side and having a convex shape protruding to the second interconnect side.

2. The device of claim 1, wherein the at least one of the second interconnects includes a third face provided on the first interconnect side and having a curved plane shape.

3. The device of claim 2, wherein the third face has a convex shape protruding to the first interconnect side or a concave shape recessed from the first interconnect side.

4. The device of claim 1, wherein
   a curvature of the first face is different from a curvature of the second face.

5. The device of claim 1, wherein an upper face or a lower face of a first insulator of the plurality of first insulators has a tapered shape or a round shape in a vicinity of the first interconnect.

6. The device of claim 1, wherein the first metal layer contains titanium and oxygen, and/or contains halogen or phosphorus.

7. The device of claim 1, wherein
   one of the first metal layer and the first semiconductor layer includes the first face protruding to the first interconnect side and the second face protruding to the second interconnect side, and
   the other of the first metal layer and the first semiconductor layer is provided above a second interconnect, below the second interconnect, and between the first interconnect and the second interconnect.

8. The device of claim 1, wherein the first metal layer and the first semiconductor layer are separated for each second interconnect.

9. The device of claim 1, wherein the first interconnect includes a first interconnect layer provided on the second interconnect side, a second interconnect layer provided on an opposite side to the second interconnects, and a second insulator provided between the first interconnect layer and the second interconnect layer.

10. The device of claim 9, wherein the second insulator contains silicon and nitrogen.

11. A method of manufacturing a semiconductor storage device, comprising:
- forming a plurality of first insulators and a first film between the first insulators on a substrate;
- forming a first interconnect that penetrates the plurality of first insulators and the first film;
- forming a cavity between the first insulators by removing the first film after forming the first interconnect;
- forming a resistance change film on upper and lower faces of the first insulators exposed toward the cavity and on a lateral face of the first interconnect exposed toward the cavity; and
- forming a second interconnect in the cavity via the resistance change film,
- wherein the resistance change film is formed so as to include a first metal layer or a first semiconductor layer that includes a first face provided on a first interconnect side and having a convex shape protruding to the first interconnect side and a second face provided on a second interconnect side and having a convex shape protruding to the second interconnect side.

12. The method of claim 11, wherein the first interconnect is formed so as to include a first interconnect layer provided on the second interconnect side, a second interconnect layer provided on an opposite side to the second interconnects, and a second insulator provided between the first interconnect layer and the second interconnect layer.

\* \* \* \* \*